United States Patent
Wang et al.

(10) Patent No.: US 7,115,499 B2
(45) Date of Patent: *Oct. 3, 2006

(54) CYCLICAL DEPOSITION OF TUNGSTEN NITRIDE FOR METAL OXIDE GATE ELECTRODE

(75) Inventors: Shulin Wang, Campbell, CA (US); Ulrich Kroemer, Jena (DE); Lee Luo, Fremont, CA (US); Aihua Chen, San Jose, CA (US); Ming Li, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/003,020

(22) Filed: Dec. 1, 2004

(65) Prior Publication Data
US 2005/0176240 A1  Aug. 11, 2005

Related U.S. Application Data

(63) Continuation of application No. 10/084,767, filed on Feb. 26, 2002, now Pat. No. 6,833,161.

(51) Int. Cl.
*H01L 21/4763* (2006.01)
(52) U.S. Cl. ..................... 438/627; 438/648
(58) Field of Classification Search ........ 438/627, 438/633, 648, 674, 685
See application file for complete search history.

(56) References Cited

U.S. PATENT DOCUMENTS

| | | | |
|---|---|---|---|
| 4,058,430 A | 11/1977 | Suntola et al. |
| 4,389,973 A | 6/1983 | Suntola et al. |
| 4,413,022 A | 11/1983 | Suntola et al. |
| 4,486,487 A | 12/1984 | Skarp |
| 4,767,494 A | 8/1988 | Kobayashi et al. |
| 4,806,321 A | 2/1989 | Nishizawa et al. |
| 4,813,846 A | 3/1989 | Helms |
| 4,829,022 A | 5/1989 | Kobayashi et al. |
| 4,834,831 A | 5/1989 | Nishizawa et al. |
| 4,838,983 A | 6/1989 | Schumaker et al. |
| 4,838,993 A | 6/1989 | Aoki et al. |
| 4,840,921 A | 6/1989 | Matsumoto |
| 4,845,049 A | 7/1989 | Sunakawa |
| 4,856,307 A | 8/1989 | Nishizawa et al. |
| 4,859,627 A | 8/1989 | Sunakawa |
| 4,861,417 A | 8/1989 | Mochizuki et al. |
| 4,876,218 A | 10/1989 | Pessa et al. |
| 4,917,556 A | 4/1990 | Stark et al. |
| 4,927,670 A | 5/1990 | Erbil |

(Continued)

FOREIGN PATENT DOCUMENTS

DE 196 27 017 A1 7/1995

(Continued)

OTHER PUBLICATIONS

Bader, et al. "Integrated Processing Equipment", Solid State Technology, Cowan Pub., vol. 33, No. 5 (May 1, 1990), pp. 149-154.

(Continued)

*Primary Examiner*—Phuc T. Dang
(74) *Attorney, Agent, or Firm*—Patterson & Sheridan LLP

(57) ABSTRACT

A method for depositing a tungsten nitride layer is provided. The method includes a cyclical process of alternately adsorbing a tungsten-containing compound and a nitrogen-containing compound on a substrate. The barrier layer has a reduced resistivity, lower concentration of fluorine, and can be deposited at any desired thickness, such as less than 100 angstroms, to minimize the amount of barrier layer material.

23 Claims, 8 Drawing Sheets

U.S. PATENT DOCUMENTS

| | | | |
|---|---|---|---|
| 4,931,132 A | 6/1990 | Aspnes et al. | |
| 4,951,601 A | 8/1990 | Maydan et al. | |
| 4,960,720 A | 10/1990 | Shimbo | |
| 4,975,252 A | 12/1990 | Nishizawa et al. | |
| 4,993,357 A | 2/1991 | Scholz | |
| 5,000,113 A | 3/1991 | Wang et al. | |
| 5,013,683 A | 5/1991 | Petroff et al. | |
| 5,028,565 A | 7/1991 | Chang et al. | |
| 5,082,798 A | 1/1992 | Arimoto | |
| 5,085,885 A | 2/1992 | Foley et al. | |
| 5,091,320 A | 2/1992 | Aspnes et al. | |
| 5,130,269 A | 7/1992 | Kitahara et al. | |
| 5,166,092 A | 11/1992 | Mochizuki et al. | |
| 5,173,474 A | 12/1992 | Connell et al. | |
| 5,186,718 A | 2/1993 | Tepman et al. | |
| 5,205,077 A | 4/1993 | Wittstock | |
| 5,225,366 A | 7/1993 | Yoder | |
| 5,234,561 A | 8/1993 | Randhawa et al. | |
| 5,246,536 A | 9/1993 | Nishizawa et al. | |
| 5,250,148 A | 10/1993 | Nishizawa et al. | |
| 5,254,207 A | 10/1993 | Nishizawa et al. | |
| 5,256,244 A | 10/1993 | Ackerman | |
| 5,259,881 A | 11/1993 | Edwards et al. | |
| 5,270,247 A | 12/1993 | Sakuma et al. | |
| 5,278,435 A | 1/1994 | Van Hove et al. | |
| 5,281,274 A | 1/1994 | Yoder | |
| 5,286,296 A | 2/1994 | Sato et al. | |
| 5,290,748 A | 3/1994 | Knuuttila et al. | |
| 5,294,286 A | 3/1994 | Nishizawa et al. | |
| 5,296,403 A | 3/1994 | Nishizawa et al. | |
| 5,300,186 A | 4/1994 | Kitahara et al. | |
| 5,306,666 A | 4/1994 | Izumi et al. | |
| 5,311,055 A | 5/1994 | Goodman et al. | |
| 5,316,615 A | 5/1994 | Copel | |
| 5,316,793 A | 5/1994 | Wallace et al. | |
| 5,330,610 A | 7/1994 | Eres et al. | |
| 5,336,324 A | 8/1994 | Stall et al. | |
| 5,338,389 A | 8/1994 | Nishizawa et al. | |
| 5,348,911 A | 9/1994 | Jurgensen et al. | |
| 5,374,570 A | 12/1994 | Nasu et al. | |
| 5,395,791 A | 3/1995 | Cheng et al. | |
| 5,438,952 A | 8/1995 | Otsuka | |
| 5,439,876 A | 8/1995 | Graf et al. | |
| 5,441,703 A | 8/1995 | Jurgensen | |
| 5,443,033 A | 8/1995 | Nishizawa et al. | |
| 5,443,647 A | 8/1995 | Aucoin et al. | |
| 5,455,072 A | 10/1995 | Bension et al. | |
| 5,458,084 A | 10/1995 | Thorne et al. | |
| 5,469,806 A | 11/1995 | Mochizuki et al. | |
| 5,480,818 A | 1/1996 | Matsumoto et al. | |
| 5,483,919 A | 1/1996 | Yokoyama et al. | |
| 5,484,664 A | 1/1996 | Kitahara et al. | |
| 5,503,875 A | 4/1996 | Imai et al. | |
| 5,521,126 A | 5/1996 | Okamura et al. | |
| 5,527,733 A | 6/1996 | Nishizawa et al. | |
| 5,532,511 A | 7/1996 | Nishizawa et al. | |
| 5,540,783 A | 7/1996 | Eres et al. | |
| 5,580,380 A | 12/1996 | Liu et al. | |
| 5,601,651 A | 2/1997 | Watabe | |
| 5,609,689 A | 3/1997 | Kato et al. | |
| 5,616,181 A | 4/1997 | Yamamoto et al. | |
| 5,637,530 A | 6/1997 | Gaines et al. | |
| 5,641,984 A | 6/1997 | Aftergut et al. | |
| 5,644,128 A | 7/1997 | Wollnik et al. | |
| 5,667,592 A | 9/1997 | Boitnott et al. | |
| 5,674,786 A | 10/1997 | Turner et al. | |
| 5,693,139 A | 12/1997 | Nishizawa et al. | |
| 5,695,564 A | 12/1997 | Imahashi | |
| 5,705,224 A | 1/1998 | Murota et al. | |
| 5,707,880 A | 1/1998 | Aftergut et al. | |
| 5,711,811 A | 1/1998 | Suntola et al. | |
| 5,730,801 A | 3/1998 | Tepman et al. | |
| 5,730,802 A | 3/1998 | Ishizumi et al. | |
| 5,747,113 A | 5/1998 | Tsai | |
| 5,749,974 A | 5/1998 | Habuka et al. | |
| 5,788,447 A | 8/1998 | Yonemitsu et al. | |
| 5,788,799 A | 8/1998 | Steger et al. | |
| 5,796,116 A | 8/1998 | Nakata et al. | |
| 5,801,634 A | 9/1998 | Young et al. | |
| 5,804,488 A | 9/1998 | Shih et al. | |
| 5,807,792 A | 9/1998 | Ilg et al. | |
| 5,830,270 A | 11/1998 | McKee et al. | |
| 5,834,372 A | 11/1998 | Lee | |
| 5,835,677 A | 11/1998 | Li et al. | |
| 5,851,849 A | 12/1998 | Comizzoli et al. | |
| 5,855,675 A | 1/1999 | Doering et al. | |
| 5,855,680 A | 1/1999 | Soininen et al. | |
| 5,856,219 A | 1/1999 | Naito et al. | |
| 5,858,102 A | 1/1999 | Tsai | |
| 5,866,213 A | 2/1999 | Foster et al. | |
| 5,866,795 A | 2/1999 | Wang et al. | |
| 5,879,459 A | 3/1999 | Gadgil et al. | |
| 5,882,165 A | 3/1999 | Maydan et al. | |
| 5,882,413 A | 3/1999 | Beaulieu et al. | |
| 5,904,565 A | 5/1999 | Nguyen et al. | |
| 5,916,365 A | 6/1999 | Sherman | |
| 5,923,056 A | 7/1999 | Lee et al. | |
| 5,923,985 A | 7/1999 | Aoki et al. | |
| 5,925,574 A | 7/1999 | Aoki et al. | |
| 5,928,389 A | 7/1999 | Jevtic | |
| 5,942,040 A | 8/1999 | Kim et al. | |
| 5,947,710 A | 9/1999 | Cooper et al. | |
| 5,972,430 A | 10/1999 | DiMeo, Jr. et al. | |
| 6,001,669 A | 12/1999 | Gaines et al. | |
| 6,015,590 A | 1/2000 | Suntola et al. | |
| 6,025,627 A | 2/2000 | Forbes et al. | |
| 6,036,773 A | 3/2000 | Wang et al. | |
| 6,042,652 A | 3/2000 | Hyun et al. | |
| 6,043,177 A | 3/2000 | Falconer et al. | |
| 6,051,286 A | 4/2000 | Zhao et al. | |
| 6,062,798 A | 5/2000 | Muka | |
| 6,071,808 A | 6/2000 | Merchant et al. | |
| 6,084,302 A | 7/2000 | Sandhu | |
| 6,086,677 A | 7/2000 | Umotoy et al. | |
| 6,110,556 A | 8/2000 | Bang et al. | |
| 6,113,977 A | 9/2000 | Soininen et al. | |
| 6,117,244 A | 9/2000 | Bang et al. | |
| 6,124,158 A | 9/2000 | Dautartas et al. | |
| 6,130,147 A | 10/2000 | Major et al. | |
| 6,139,700 A | 10/2000 | Kang et al. | |
| 6,140,237 A | 10/2000 | Chan et al. | |
| 6,140,238 A | 10/2000 | Kitch | |
| 6,143,659 A | 11/2000 | Leem | |
| 6,144,060 A | 11/2000 | Park et al. | |
| 6,156,382 A | 12/2000 | Rajagopalan et al. | |
| 6,158,446 A | 12/2000 | Mohindra et al. | |
| 6,174,377 B1 | 1/2001 | Doering et al. | |
| 6,174,809 B1 | 1/2001 | Kang et al. | |
| 6,200,893 B1 | 3/2001 | Sneh | |
| 6,203,613 B1 | 3/2001 | Gates et al. | |
| 6,206,967 B1 | 3/2001 | Mak et al. | |
| 6,207,302 B1 | 3/2001 | Sugiura et al. | |
| 6,207,487 B1 | 3/2001 | Kim et al. | |
| 6,218,298 B1 | 4/2001 | Hoinkis | |
| 6,248,605 B1 | 6/2001 | Harkonen et al. | |
| 6,270,572 B1 | 8/2001 | Kim et al. | |
| 6,271,148 B1 | 8/2001 | Kao et al. | |
| 6,284,646 B1 | 9/2001 | Leem | |
| 6,287,965 B1 | 9/2001 | Kang et al. | |
| 6,291,876 B1 | 9/2001 | Stumborg et al. | |
| 6,305,314 B1 | 10/2001 | Sneh et al. | |
| 6,306,216 B1 | 10/2001 | Kim et al. | |
| 6,316,098 B1 | 11/2001 | Yitzchaik et al. | |
| 6,333,260 B1 | 12/2001 | Kwon et al. | |

| Patent Number | Date | Inventor |
|---|---|---|
| 6,335,280 B1 | 1/2002 | Van der Jeugd |
| 6,342,277 B1 | 1/2002 | Sherman |
| 6,355,561 B1 | 3/2002 | Sandhu et al. |
| 6,358,829 B1 | 3/2002 | Yoon et al. |
| 6,368,954 B1 | 4/2002 | Lopatin et al. |
| 6,369,430 B1 | 4/2002 | Adetutu et al. |
| 6,372,598 B1 | 4/2002 | Kang et al. |
| 6,391,785 B1 | 5/2002 | Satta et al. |
| 6,391,803 B1 | 5/2002 | Kim et al. |
| 6,399,484 B1 * | 6/2002 | Yamasaki et al. ........... 438/648 |
| 6,399,491 B1 | 6/2002 | Jeon et al. |
| 6,416,822 B1 | 7/2002 | Chiang et al. |
| 6,420,189 B1 | 7/2002 | Lopatin |
| 6,423,619 B1 | 7/2002 | Grant et al. |
| 6,428,859 B1 | 8/2002 | Chiang et al. |
| 6,447,933 B1 | 9/2002 | Wang et al. |
| 6,451,119 B1 | 9/2002 | Sneh et al. |
| 6,451,695 B1 | 9/2002 | Sneh |
| 6,468,924 B1 | 10/2002 | Lee et al. |
| 6,472,323 B1 * | 10/2002 | Meikle et al. ............... 438/685 |
| 6,475,276 B1 | 11/2002 | Elers et al. |
| 6,475,910 B1 | 11/2002 | Sneh |
| 6,482,262 B1 | 11/2002 | Elers et al. |
| 6,482,733 B1 | 11/2002 | Raaijmakers et al. |
| 6,482,740 B1 | 11/2002 | Soininen et al. |
| 6,511,539 B1 | 1/2003 | Raaijmakers |
| 6,534,395 B1 | 3/2003 | Werkhoven et al. |
| 6,551,929 B1 | 4/2003 | Kori et al. |
| 6,569,501 B1 | 5/2003 | Chiang et al. |
| 6,599,572 B1 | 7/2003 | Saanila et al. |
| 6,607,976 B1 | 8/2003 | Chen et al. |
| 6,620,723 B1 | 9/2003 | Byun et al. |
| 6,630,201 B1 | 10/2003 | Chaing et al. |
| 6,635,965 B1 | 10/2003 | Lee et al. |
| 6,660,126 B1 | 12/2003 | Nguyen et al. |
| 6,686,271 B1 | 2/2004 | Raaijmakers et al. |
| 6,833,161 B1 * | 12/2004 | Wang et al. ................. 427/250 |
| 2001/0000866 A1 | 5/2001 | Sneh et al. |
| 2001/0002280 A1 | 5/2001 | Sneh |
| 2001/0009140 A1 | 7/2001 | Bondestam et al. |
| 2001/0009695 A1 | 7/2001 | Saanila et al. |
| 2001/0011526 A1 | 8/2001 | Doering et al. |
| 2001/0024387 A1 | 9/2001 | Raaijmakers et al. |
| 2001/0028924 A1 | 10/2001 | Sherman |
| 2001/0029094 A1 | 10/2001 | Mee-Young et al. |
| 2001/0031562 A1 | 10/2001 | Raaijmakers et al. |
| 2001/0034123 A1 | 10/2001 | Jeon et al. |
| 2001/0041250 A1 | 11/2001 | Werkhoven et al. |
| 2001/0042799 A1 | 11/2001 | Kim et al. |
| 2001/0054730 A1 | 12/2001 | Kim et al. |
| 2001/0054769 A1 | 12/2001 | Raiijmakers et al. |
| 2002/0000598 A1 | 1/2002 | Kang et al. |
| 2002/0004293 A1 | 1/2002 | Soininen et al. |
| 2002/0007790 A1 | 1/2002 | Park |
| 2002/0016084 A1 | 2/2002 | Todd |
| 2002/0019121 A1 | 2/2002 | Pyo |
| 2002/0031618 A1 | 3/2002 | Sherman |
| 2002/0037630 A1 | 3/2002 | Agarwal et al. |
| 2002/0047151 A1 | 4/2002 | Kim et al. |
| 2002/0048880 A1 | 4/2002 | Lee |
| 2002/0052097 A1 | 5/2002 | Park |
| 2002/0055235 A1 | 5/2002 | Agarwal et al. |
| 2002/0060363 A1 | 5/2002 | Xi et al. |
| 2002/0061612 A1 | 5/2002 | Sandhu et al. |
| 2002/0068458 A1 | 6/2002 | Chiang et al. |
| 2002/0073924 A1 | 6/2002 | Chiang et al. |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0076837 A1 | 6/2002 | Hujanen et al. |
| 2002/0086507 A1 | 7/2002 | Park et al. |
| 2002/0090829 A1 | 7/2002 | Sandhu et al. |
| 2002/0094689 A1 | 7/2002 | Park |
| 2002/0104481 A1 | 8/2002 | Chiang et al. |
| 2002/0105088 A1 | 8/2002 | Yang et al. |
| 2002/0106846 A1 | 8/2002 | Seutter et al. |
| 2002/0109168 A1 | 8/2002 | Kim et al. |
| 2002/0117399 A1 | 8/2002 | Chen et al. |
| 2002/0121241 A1 | 9/2002 | Nguyen et al. |
| 2002/0121342 A1 | 9/2002 | Nguyen et al. |
| 2002/0121697 A1 | 9/2002 | Marsh |
| 2002/0144655 A1 | 10/2002 | Chiang et al. |
| 2002/0144657 A1 | 10/2002 | Chiang et al. |
| 2002/0146511 A1 | 10/2002 | Chiang et al. |
| 2002/0155722 A1 | 10/2002 | Satta et al. |
| 2002/0162506 A1 | 11/2002 | Sneh et al. |
| 2002/0164421 A1 | 11/2002 | Chiang et al. |
| 2002/0164423 A1 | 11/2002 | Chiang et al. |
| 2002/0182320 A1 | 12/2002 | Leskela et al. |
| 2002/0187256 A1 | 12/2002 | Elers et al. |
| 2002/0187631 A1 | 12/2002 | Kim et al. |
| 2002/0197402 A1 | 12/2002 | Chiang et al. |
| 2002/0197863 A1 | 12/2002 | Mak et al. |
| 2003/0013300 A1 | 1/2003 | Byun |
| 2003/0013320 A1 | 1/2003 | Kim et al. |
| 2003/0031807 A1 | 2/2003 | Elers et al. |
| 2003/0032281 A1 | 2/2003 | Werkhoven et al. |
| 2003/0049931 A1 | 3/2003 | Byun et al. |
| 2003/0049942 A1 | 3/2003 | Haukka et al. |
| 2003/0053799 A1 | 3/2003 | Lei |
| 2003/0054631 A1 | 3/2003 | Raaijmakers et al. |
| 2003/0072975 A1 | 4/2003 | Shero et al. |
| 2003/0082296 A1 | 5/2003 | Elers et al. |
| 2003/0082301 A1 | 5/2003 | Chen et al. |
| 2003/0086111 A1 | 5/2003 | Akiyoshi |
| 2003/0104126 A1 | 6/2003 | Fang et al. |
| 2003/0116087 A1 | 6/2003 | Nguyen et al. |
| 2003/0123216 A1 | 7/2003 | Yoon et al. |
| 2003/0129826 A1 | 7/2003 | Werkhoven et al. |
| 2003/0134508 A1 | 7/2003 | Raaijmakers et al. |
| 2003/0143328 A1 | 7/2003 | Chen et al. |
| 2003/0143839 A1 | 7/2003 | Raaijmakers et al. |
| 2003/0153181 A1 | 8/2003 | Yoon et al. |
| 2003/0161952 A1 | 8/2003 | Wang et al. |
| 2003/0186495 A1 | 10/2003 | Saanita et al. |
| 2003/0190423 A1 | 10/2003 | Yang et al. |
| 2003/0190804 A1 | 10/2003 | Yasuda et al. |
| 2003/0194493 A1 | 10/2003 | Chang et al. |
| 2003/0194825 A1 | 10/2003 | Law et al. |
| 2003/0203616 A1 | 10/2003 | Chung et al. |
| 2003/0224217 A1 | 12/2003 | Byun et al. |
| 2004/0009307 A1 | 1/2004 | Koh et al. |
| 2004/0011504 A1 | 1/2004 | Ku et al. |
| 2004/0013577 A1 | 1/2004 | Ganguli et al. |
| 2004/0014315 A1 | 1/2004 | Lai et al. |
| 2004/0014320 A1 | 1/2004 | Chen et al. |
| 2004/0015300 A1 | 1/2004 | Ganguli et al. |
| 2004/0018304 A1 | 1/2004 | Chung et al. |
| 2004/0018723 A1 | 1/2004 | Byun et al. |
| 2004/0041320 A1 | 3/2004 | Hodumi |

FOREIGN PATENT DOCUMENTS

| | | |
|---|---|---|
| DE | 198 20 147 A1 | 12/1997 |
| EP | 0 344 352 | 12/1989 |
| EP | 0 429 270 | 5/1991 |
| EP | 0 442 290 | 8/1991 |
| EP | 0 799 641 | 10/1997 |
| EP | 1 167 569 | 1/2002 |
| FR | 2 626 110 | 7/1989 |
| FR | 2 692 597 | 12/1993 |
| GB | 2 355 727 A | 5/2001 |
| JP | 58-098917 | 6/1983 |
| JP | 58-100419 | 6/1983 |
| JP | 60-065712 | 4/1985 |
| JP | 61-035847 | 2/1986 |

| | | | | | |
|---|---|---|---|---|---|
| JP | 61-210623 | 9/1986 | JP | 04-100292 | 4/1992 |
| JP | 62-069508 | 3/1987 | JP | 04-111418 | 4/1992 |
| JP | 62-091495 | 4/1987 | JP | 04-132214 | 5/1992 |
| JP | 62-141717 | 6/1987 | JP | 04-132681 | 5/1992 |
| JP | 62-167297 | 7/1987 | JP | 04-151822 | 5/1992 |
| JP | 62-171999 | 7/1987 | JP | 04-162418 | 6/1992 |
| JP | 62-232919 | 10/1987 | JP | 04-175299 | 6/1992 |
| JP | 63-062313 | 3/1988 | JP | 04-186824 | 7/1992 |
| JP | 63-085098 | 4/1988 | JP | 04-212411 | 8/1992 |
| JP | 63-090833 | 4/1988 | JP | 04-260696 | 9/1992 |
| JP | 63-222420 | 9/1988 | JP | 04-273120 | 9/1992 |
| JP | 63-222421 | 9/1988 | JP | 04-285167 | 10/1992 |
| JP | 63-227007 | 9/1988 | JP | 04-291916 | 10/1992 |
| JP | 63-252420 | 10/1988 | JP | 04-325500 | 11/1992 |
| JP | 63-266814 | 11/1988 | JP | 04-328874 | 11/1992 |
| JP | 64-009895 | 1/1989 | JP | 05-029228 | 2/1993 |
| JP | 64-009896 | 1/1989 | JP | 05-047665 | 2/1993 |
| JP | 64-009897 | 1/1989 | JP | 05-047666 | 2/1993 |
| JP | 64-037832 | 2/1989 | JP | 05-047668 | 2/1993 |
| JP | 64-082615 | 3/1989 | JP | 05-074717 | 3/1993 |
| JP | 64-082617 | 3/1989 | JP | 05-074724 | 3/1993 |
| JP | 64-082671 | 3/1989 | JP | 05-102189 | 4/1993 |
| JP | 64-082676 | 3/1989 | JP | 05-160152 | 6/1993 |
| JP | 01-103982 | 4/1989 | JP | 05-175143 | 7/1993 |
| JP | 01-103996 | 4/1989 | JP | 05-175145 | 7/1993 |
| JP | 64-090524 | 4/1989 | JP | 05-182906 | 7/1993 |
| JP | 01-117017 | 5/1989 | JP | 05-186295 | 7/1993 |
| JP | 01-143221 | 6/1989 | JP | 05-206036 | 8/1993 |
| JP | 01-143233 | 6/1989 | JP | 05-234899 | 9/1993 |
| JP | 01-154511 | 6/1989 | JP | 05-235047 | 9/1993 |
| JP | 01-236657 | 9/1989 | JP | 05-251339 | 9/1993 |
| JP | 01-245512 | 9/1989 | JP | 05-270997 | 10/1993 |
| JP | 01-264218 | 10/1989 | JP | 05-283336 | 10/1993 |
| JP | 01-270593 | 10/1989 | JP | 05-291152 | 11/1993 |
| JP | 01-272108 | 10/1989 | JP | 05-304334 | 11/1993 |
| JP | 01-290221 | 11/1989 | JP | 05-343327 | 12/1993 |
| JP | 01-290222 | 11/1989 | JP | 05-343685 | 12/1993 |
| JP | 01-296673 | 11/1989 | JP | 06-045606 | 2/1994 |
| JP | 01-303770 | 12/1989 | JP | 06-132236 | 5/1994 |
| JP | 01-305894 | 12/1989 | JP | 06-177381 | 6/1994 |
| JP | 01-313927 | 12/1989 | JP | 06-196809 | 7/1994 |
| JP | 02-012814 | 1/1990 | JP | 06-222388 | 8/1994 |
| JP | 02-014513 | 1/1990 | JP | 06-224138 | 8/1994 |
| JP | 02-017634 | 1/1990 | JP | 06-230421 | 8/1994 |
| JP | 02-063115 | 3/1990 | JP | 06-252057 | 9/1994 |
| JP | 02-074029 | 3/1990 | JP | 06-291048 | 10/1994 |
| JP | 02-074587 | 3/1990 | JP | 07-070752 | 3/1995 |
| JP | 02-106822 | 4/1990 | JP | 07-086269 | 3/1995 |
| JP | 02-129913 | 5/1990 | JP | 08-181076 | 7/1996 |
| JP | 02-162717 | 6/1990 | JP | 08-245291 | 9/1996 |
| JP | 02-172895 | 7/1990 | JP | 08-264530 | 10/1996 |
| JP | 02-196092 | 8/1990 | JP | 09-260786 | 10/1997 |
| JP | 02-203517 | 8/1990 | JP | 09-293681 | 11/1997 |
| JP | 02-230690 | 9/1990 | JP | 10-188840 | 7/1998 |
| JP | 02-230722 | 9/1990 | JP | 10-190128 | 7/1998 |
| JP | 02-246161 | 10/1990 | JP | 10-308283 | 11/1998 |
| JP | 02-264491 | 10/1990 | JP | 11-269652 | 10/1999 |
| JP | 02-283084 | 11/1990 | JP | 2000-031387 | 1/2000 |
| JP | 02-304916 | 12/1990 | JP | 2000-058777 | 2/2000 |
| JP | 03-019211 | 1/1991 | JP | 2000-068072 | 3/2000 |
| JP | 03-022569 | 1/1991 | JP | 2000-087029 | 3/2000 |
| JP | 03-023294 | 1/1991 | JP | 2000-138094 | 5/2000 |
| JP | 03-023299 | 1/1991 | JP | 2000-178735 | 6/2000 |
| JP | 03-044967 | 2/1991 | JP | 2000-218445 | 8/2000 |
| JP | 03-048421 | 3/1991 | JP | 2000-319772 | 11/2000 |
| JP | 03-070124 | 3/1991 | JP | 2000-340883 | 12/2000 |
| JP | 03-185716 | 8/1991 | JP | 2000-353666 | 12/2000 |
| JP | 03-208885 | 9/1991 | JP | 2001-020075 | 1/2001 |
| JP | 03-234025 | 10/1991 | JP | 2001-62244 | 3/2001 |
| JP | 03-286522 | 12/1991 | JP | 2001-111000 | 4/2001 |
| JP | 03-286531 | 12/1991 | JP | 2001-152339 | 6/2001 |
| JP | 04-031391 | 2/1992 | JP | 2001-172767 | 6/2001 |
| JP | 04-031396 | 2/1992 | JP | 2001-189312 | 7/2001 |

| JP | 2001-217206 | 8/2001 |
| JP | 2001-220287 | 8/2001 |
| JP | 2001-220294 | 8/2001 |
| JP | 2001-240972 | 9/2001 |
| JP | 2001-254181 | 9/2001 |
| JP | 2001-284042 | 10/2001 |
| JP | 2001-303251 | 10/2001 |
| JP | 2001-328900 | 11/2001 |
| WO | WO 90/02216 | 3/1990 |
| WO | WO 91/10510 | 7/1991 |
| WO | WO 93/0211 | 2/1993 |
| WO | WO 96/17107 | 6/1996 |
| WO | WO 96/18756 | 6/1996 |
| WO | WO 98/06889 | 2/1998 |
| WO | WO 98/51838 | 11/1998 |
| WO | WO 99/13504 | 3/1999 |
| WO | WO 99/29924 | 6/1999 |
| WO | WO 99/41423 | 8/1999 |
| WO | WO 00/11721 | 3/2000 |
| WO | WO 00/15865 | 3/2000 |
| WO | WO 00/15881 | 3/2000 |
| WO | WO 00/16377 | 3/2000 |
| WO | WO 00/54320 | 9/2000 |
| WO | WO 00/63957 | 10/2000 |
| WO | WO 00/79019 | 12/2000 |
| WO | WO 00/79576 | 12/2000 |
| WO | WO 01/15220 | 3/2001 |
| WO | WO 01/17692 | 3/2001 |
| WO | WO 01/27346 | 4/2001 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/36702 | 5/2001 |
| WO | WO 01/40541 | 6/2001 |
| WO | WO 01/66832 | 9/2001 |
| WO | WO 02/01628 | 1/2002 |
| WO | WO 02/45167 | 1/2002 |
| WO | WO 02/45871 | 6/2002 |
| WO | WO 02/46489 | 6/2002 |
| WO | WO 02/67319 | 8/2002 |

OTHER PUBLICATIONS

Bedair, S.M. "Atomic layer epitaxy deposition processes", J. Vac. Sci. Techol. 12(1) (Jan./Feb. 1994).

Choi, et al. "Stability of $TiB_2$ as a Diffusion Barrier on Silicon", J. Electrochem. Soc. 138(10) (Oct. 1991), pp. 3062-3607.

Choi, et al. "The Effect of Annealing on Resistivity of Low Pressure Chemical Vapor Deposited Titanium Diboride", Journal of Applied Physics, Jun. 1, 1991, pp. 7853-7861.

Derbyshire, K. "Applications of Integrated processing", Solid State Technology, US, Cowan Pub., vol. 37, No. 12 (Dec. 1, 1994), pp. 45-47.

Elers, et al. "$NbCl_5$ as a precursor in atomic layer epitaxy", Appl. Surf. Sci., vol. 82/83 (1994), pp. 468-474.

George, et al. "Atomic layer controlled deposition of $SiO_2$ and $Al_2O_3$ using ABAB . . . binary reaction sequence chemistry", Appl. Surf. Sci., vol. 82/83 (1994), pp. 460-467.

George, et al. "Surface Chemistry for Atomic Layer Growth", J. Phys. Chem. 1996, 100, 13121-13131.

Hultman, et al. "Review of the thermal and mechanical stability of TiN-based thin films", Zeitschrift Fur Metallkunde, 90 (10) (Oct. 1999), pp. 803-813.

IBM Tech. Disc. Bull. Knowledge-Based Dynamic Scheduler in Distributed Computer Control, (Jun. 1990), pp. 80-84.

IBM Tech. Disc. Bull. "Multiprocessor and Multitasking Architecture for Tool Control of the Advanced via Inspection Tools" (May 1992), pp. 190-191.

Kitigawa, et al. "Hydrogen-mediated low temperature epitaxy of Si in plasma-enhanced chemical vapor deposition", Applied Surface Science (2000), pp. 30-34.

Klaus, et al. "Atomic Layer Deposition of $SiO_2$ Using Catalyzed and Uncatalyzed Self-Limiting Surface Reactions", Surface Review and Letters, vol. 6, Nos. 3 & 4 (1999) pp. 435-448.

Klaus, et al. "Atomically Controlled Growth of Tungsten and Tungsten Nitride Using Sequential Surface Reactions", Applied Surface Science, 162-163 (2000) pp. 479-491.

Lee, C. "The Preparation of Titanium-Based Thin Film by CVD Using Titanium Chlorides as Precursors", Chemical Vapor Deposition, 5(2) Mar. 1999, pp. 69-73.

Lee, S., et al. "Pulsed Nucleation for Ultra-High Aspect Ratio Tungsten Plugfill"; Materials Research Society, 2002, pp. 649-653.

Martensson, et al., "Atomic Layer Epitaxy of Copper on Tantalum", Chemical Vapor Deposition, 3(1) (Feb. 1, 1997), pp. 45-50.

Martensson, et al. "Atomic Layer Epitaxy of Copper, Growth & Selectivity in the Cu (II)-2,2.6,6-Tetramethyl-3, 5-Heptanedion ATE/$H_2$ Process", J. Electrochem. Soc., 145(8) (Aug. 1998), pp. 2926-2931.

Maydan, D. "Cluster Tools for Fabrication of Advanced devices" Jap. J. of Applied Physics, Extended Abstracts, 22nd Conference Solid State Devices and Materials (1990), pp. 849-852, XP000178141.

McGeachin, S., "Synthesis and properties of some β-diketimines derived from acetylacetone, and their metal complexes", Canadian J. of Chemistry, vol. 46 (1968), pp. 1903-1912.

Min, et al. "Atomic Layer Deposition of TiN Thin Films by Sequential Introduction of Ti Precursor and $NH_3$", Mat. Res. Soc. Sm. Proc. vol. 514 (1998), pp. 337-342.

Min, et al. "Chemical Vapor Deposition of Ti-Si-N Films With Alternating Source Supply", Mat. Rec. Soc. Symp. Proc. vol. (1999), pp. 207-210.

Min, et al. "Metal-organic Atomic-layer Deposition of Titanium-silicon-nitride films", Applied Physics Letters, vol. 75, No. 11 (Sep. 13, 1999), pp. 1521-1523.

Niinisto, et al. "Synthesis of Oxide Thin Films and Overlayers by Atomic Layer Epitaxy for Advanced Applications", Materials Science and Engineering B41 (1996), pp. 23-29.

Ohba, et al. Thermal Decomposition of Methylhydrazine and Deposition Properties of CVD TiN Thin Films, Conference Proceedings, Advanced Metallization for ULSI Applications in 1993 (1994), pp. 143-149.

Ritala, et al. "Atomic Layer Epitaxy Growth of TiN Thin Films", J. Electrochem. Soc., vol. 142, No. 8, Aug. 1995, pp. 2731-2737.

Ritala, et al. "Perfectly Conformal TiN and $Al_2O_3$ Films Deposited by Atomic Layer Deposition", Chem. Vap. Deposition 1999, 5, No. 1, pp. 7-9.

Rossnagel, et al. "Plasma-enhanced Atomic Layer Deposition of Ta and Ti for Interconnect Diffusion Barriers", J. Vacuum Sci. & Tech. B., vol. 18, No. 4 (Jul. 2000), pp. 2016-2020.

Scheper, et al. "Low-temperature deposition of titanium nitride films from dialkylhydrazine-based precursors", Materials Science in Semiconductor Processing 2 (1999), pp. 149-157.

Solanki, et al. "Atomic Layer deposition of Copper Seed Layers", Electrochemical and Solid State Letters, 3(10) (2000), pp. 479-480.

Suzuki, et al. "LPCVD-TiN Using Hydrazine and $TiCl_4$", VMIC Conference (Jun. 8-9, 1993), pp. 418-423.

Wise, et al. "Diethyldiethoxysilane as a new precursor for $SiO_2$ growth on silicon", Mat. Res. Soc. Symp. Proc., vol. 334 (1994), pp. 37-43.

Yamaga, et al. "Atomic layer epitaxy of ZnS by a new gas supplying system in a low-pressure metalorganic vapor phase epitaxy", J. of Crystal Growth 117 (1992), pp. 152-155.

Yamaguchi, et al. "Atomic-layer chemical-vapor-deposition of silicon dioxide films with extremely low hydrogen content", Appl. Surf. Sci., vol. 130-132 (1998), pp. 202-207.

Yang, et al. "Atomic Layer Deposition of Tungsten Film from $WF_6/B_2H_8$: Nucleation Layer for Advanced Semiconductor Device", Conference Proceedings ULSI XVII (2002) Materials Research Society, pp. 655-660.

* cited by examiner

CYCLICAL DEPOSITION OF TUNGSTEN NITRIDE FOR METAL OXIDE GATE ELECTRODE

CROSS-REFERENCE TO RELATED APPLICATIONS

This application is a continuation of U.S. Ser. No. 10/084,767, filed Feb. 26, 2002, and issued as U.S. Pat. No. 6,833,161, which is herein incorporated by reference.

BACKGROUND OF THE INVENTION

1. Field of the Invention

Embodiments of the present invention relate to a method for manufacturing integrated circuit devices. More particularly, embodiments of the invention relate to forming stoichiometric tungsten nitride films using cyclic or atomic layer deposition.

2. Description of the Related Art

Semiconductor device geometries have dramatically decreased in size since such devices were first introduced several decades ago and are continually decreasing in size today. Metal gates made of tungsten are becoming important because of the resistance requirements of these smaller devices. Tungsten is a desirable material because it is widely available and has a lower resistivity and lower contact resistance compared to other conductive metals.

One drawback to using tungsten in a metal gate, however, is that a barrier layer is typically required between silicon and the tungsten to prevent the formation of tungsten silicide. Tungsten silicide has a higher resistivity than tungsten and thus, increases the overall resistance of the gate. Barrier layers, however, also increase the resistance of the device and are deposited in amounts greater than needed due to the inherent limitations of conventional deposition techniques.

Bulk deposition processes, such as physical vapor deposition (PVD) and chemical vapor deposition (CVD), are conventionally used to deposit barrier layers. Bulk deposition processes are high deposition rate processes that maintain certain deposition conditions for a period of time to deposit material having a desired thickness, typically greater than 1,000 angstroms. This time period varies depending on the dynamics of the reaction and can be complicated where a reaction condition must be maintained for a brief period of time in order to deposit a controllable and repeatable thin layer of material.

There is a need, therefore, for new methods for depositing controllable, repeatable, and thin barrier layers.

SUMMARY OF THE INVENTION

Embodiments of the invention include a method for forming a tungsten nitride layer by alternately pulsing a tungsten-containing compound and a nitrogen-containing compound until a tungsten nitride layer having a thickness of about 100 angstroms or less is formed.

Embodiments of the invention also include a method for forming a tungsten layer comprising depositing a tungsten nitride barrier layer by alternately pulsing a first tungsten-containing compound and a nitrogen-containing compound, and depositing a tungsten layer by alternately pulsing a second tungsten-containing compound and a reducing compound.

Embodiments of the invention further include a method for forming a tungsten layer, comprising depositing a tungsten nitride barrier layer by alternately pulsing a first tungsten-containing compound and a nitrogen-containing compound, and depositing a tungsten layer on the barrier layer. In one aspect, the tungsten layer is deposited by chemical vapor deposition or physical vapor deposition techniques. In another aspect, the tungsten layer is deposited by alternately pulsing a second tungsten-containing compound and a reducing compound. In yet another aspect, the tungsten layer is deposited by alternately pulsing the second tungsten-containing compound and the reducing compound to form a pre-layer having a thickness of about 50 angstroms or less followed by bulk tungsten deposition using chemical vapor deposition or physical vapor deposition.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
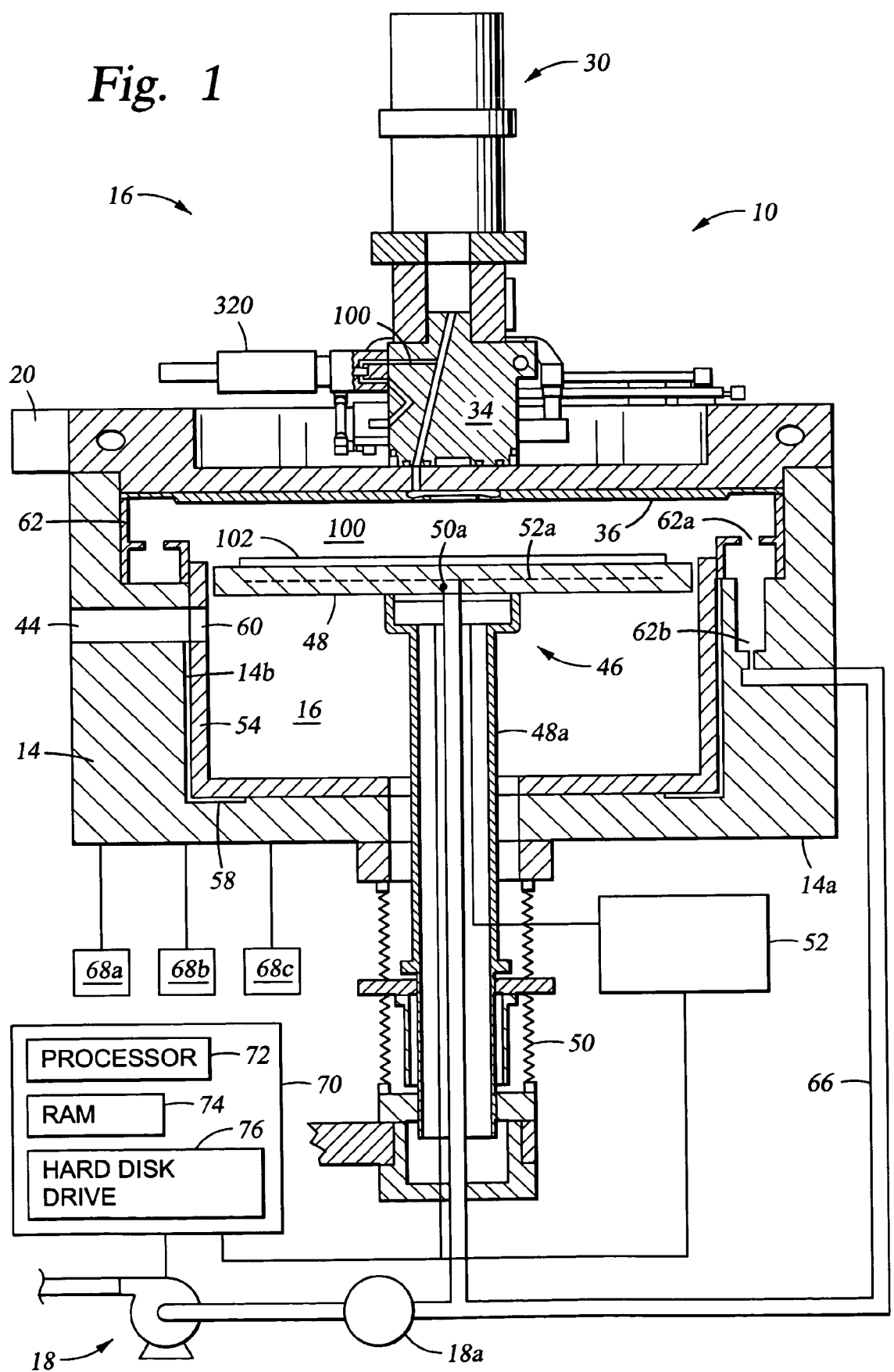
FIG. 1 depicts a schematic cross-sectional view of a process chamber that can be used to practice embodiments described herein.

A tungsten nitride layer ($W_xN_y$) having a thickness less than 100 angstroms, such as about 20 angstroms or less, is formed using embodiments of a cyclical deposition technique described herein. The tungsten nitride layer has a resistivity of about 380 µΩ-cm or less, and provides excellent barrier properties for various device applications, such as an electrode in either DRAM or capacitors for example, without subsequent thermal treatment. The tungsten nitride layer also has a significantly reduced fluorine concentration compared to tungsten nitride layers deposited by conventional bulk deposition techniques, such as plasma enhanced chemical vapor deposition (PECVD). The tungsten nitride layer is particularly useful for devices having dimensions of 0.15 microns or less, such as 100 nm (nanometers).

"Cyclical deposition" as used herein refers to the sequential introduction of two or more reactive compounds to deposit a mono layer of material on a substrate surface. The two or more reactive compounds are sequentially introduced into a reaction zone of a processing chamber. Each reactive compound is separated by a delay/pause to allow each compound to adhere and/or react on the substrate surface. In one aspect, a first precursor or compound A is dosed/pulsed into the reaction zone followed by a first time delay/pause. Next, a second precursor or compound B is dosed/pulsed into the reaction zone followed by a second delay. The reactive compounds are alternatively pulsed until a desired film or film thickness is formed on the substrate surface.

In one aspect, a tungsten nitride layer is deposited on a substrate surface by alternately adsorbing a tungsten-containing compound and a nitrogen-containing compound on a substrate surface. The term "compound" is intended to include one or more precursors, reductants, reactants, and catalysts. Each compound may be a single compound or a mixture/combination of two or more compounds. During deposition, the substrate should be maintained at a temperature of about 550° C. or more, such as between 550° C. and 700° C., at a process chamber pressure of between about 1 Torr and about 10 Torr. The tungsten-containing compound is introduced to the substrate surface at a rate between about 1 sccm (standard cubic centimeters per minute) and about 400 sccm, such as between about 10 sccm and about 100 sccm, and pulsed for about 1 second or less, such as about 0.2 seconds or less. The nitrogen-containing compound is introduced to the substrate surface at a rate between about 5 sccm to about 150 sccm, such as between about 5 sccm and about 25 sccm, and thereafter pulsed for about 1 second or less, such as about 0.2 seconds or less. In one aspect, argon is continuously provided as a carrier/purge gas at a rate between about 250 sccm and about 1,000 sccm, such as between about 500 sccm and about 750 sccm. Each cycle, consisting of a pulse of the tungsten-containing compound and a pulse of the nitrogen-containing compound, forms between about 2 angstroms to about 3 angstroms of tungsten nitride, such as about 2.5 angstroms.

A "substrate surface", as used herein, refers to any substrate surface upon which film processing is performed. For example, a substrate surface may include silicon, silicon oxide, doped silicon, germanium, gallium arsenide, glass, sapphire, and any other materials such as metals, metal alloys, and other conductive materials, depending on the application. A substrate surface may also include dielectric materials such as silicon dioxide and carbon doped silicon oxides.

FIG. 1 illustrates a schematic, partial cross section of an exemplary processing chamber 16 useful for depositing a tungsten nitride layer according to each of the embodiments of the present invention. Such a processing chamber 16 is available from Applied Materials, Inc. located in Santa Clara, Calif., and a brief description thereof follows. A more detailed description may be found in commonly assigned U.S. Ser. No. 10/016,300, entitled, "Lid Assembly for a Processing System to Facilitate Sequential Deposition Techniques," filed on Dec. 12, 2001, published as U.S. Patent Application 20030010451, and issued as U.S. Pat. No. 6,878,206, which is incorporated herein by reference.

The processing chamber 16 may be integrated into an integrated processing platform, such as an Endura SL platform also available from Applied Materials, Inc. Details of the Endura SL platform are described in commonly assigned U.S. patent application Ser. No. 09/451,628, entitled "Integrated Modular Processing Platform," filed on Nov. 30, 1999, which is incorporated by reference herein.

Referring to FIG. 1, the processing chamber 16 includes a chamber body 14, a lid assembly 20 for gas delivery, and a thermally controlled substrate support member 46. The thermally controlled substrate support member 46 includes a wafer support pedestal 48 connected to a support shaft 48a. The thermally controlled substrate support member 46 may be moved vertically within the chamber body 14 so that a distance between the support pedestal 48 and the lid assembly 20 may be controlled. An example of a lifting mechanism for the support pedestal 48 is described in detail in U.S. Pat. No. 5,951,776, issued Sep. 14, 1999 to Selyutin et al., entitled "Self-Aligning Lift Mechanism," which is hereby incorporated by reference in it entirety.

The support pedestal 48 includes an embedded thermocouple 50a that may be used to monitor the temperature thereof. For example, a signal from the thermocouple 50a may be used in a feedback loop to control power applied to a heater element 52a by a power source 52. The heater element 52a may be a resistive heater element or other thermal transfer device disposed in or in contact with the pedestal 48 utilized to control the temperature thereof. Optionally, the support pedestal 48 may be heated using a heat transfer fluid (not shown).

The support pedestal 48 may be formed from any process-compatible material, including aluminum nitride and aluminum oxide ($Al_2O_3$ or alumina) and may also be configured to hold a substrate thereon employing a vacuum, i.e., support pedestal 48 may be a vacuum chuck. Using a vacuum check, the support pedestal 48 may include a plurality of vacuum holes (not shown) that are placed in fluid communication with a vacuum source routed through the support shaft 48a.

The chamber body 14 includes a liner assembly 54 having a cylindrical portion and a planar portion. The cylindrical portion and the planar portion may be formed from any suitable material such as aluminum, ceramic and the like. The cylindrical portion surrounds the support pedestal 48. The cylindrical portion also includes an aperture 60 that aligns with the slit valve opening 44 disposed a side wall 14b of the housing 14 to allow entry and egress of substrates from the chamber 16.

The planar portion of the liner assembly 54 extends transversely to the cylindrical portion and is disposed against a chamber bottom 14a of the chamber body 14. The liner assembly 54 defines a chamber channel 58 between the chamber body 14 and both the cylindrical portion and planar portion of the liner assembly 54. Specifically, a first portion of channel 58 is defined between the chamber bottom 14a and planar portion of the liner assembly 54. A second portion of channel 58 is defined between the sidewall 14b of the chamber body 14 and the cylindrical portion of the liner assembly 54. A purge gas is introduced into the channel 58 to minimize unwanted deposition on the chamber walls and to control the rate of heat transfer between the chamber walls and the liner assembly 54.

The chamber body 14 also includes a pumping channel 62 disposed along the sidewalls 14b thereof. The pumping channel 62 includes a plurality of apertures, one of which is shown as a first aperture 62a. The pumping channel 62 includes a second aperture 62b that is coupled to a pump system 18 by a conduit 66. A throttle valve 18a is coupled between the pumping channel 62 and the pump system 18. The pumping channel 62, the throttle valve 18a, and the pump system 18 control the amount of gas flow from the processing chamber 16. The size, number, and position of the apertures 62a in communication with the chamber 16 are configured to achieve uniform flow of gases exiting the lid assembly 20 over the support pedestal 48 having a substrate disposed thereon.

The lid assembly 20 includes a lid plate 20a having a gas manifold 34 mounted thereon. The lid plate 20a provides a fluid tight seal with an upper portion of the chamber body 14 when in a closed position. The gas manifold 34 includes a plurality of control valves 32c (only one shown) to provide rapid and precise gas flow with valve open and close cycles of less than about one second, and in one embodiment, of less than about 0.1 seconds. The valves 32c are surface mounted, electronically controlled valves. One valve that may be utilized is available from Fujikin of Japan as part number FR-21-6.35 UGF–APD. Other valves that operate at substantially the same speed and precision may also be used.

The lid assembly 20 further includes a plurality of gas sources 68a, 68b, 68c, each in fluid communication with one of the valves 32c through a sequence of conduits (not shown) formed through the chamber body 14, lid assembly 20, and gas manifold 34.

The processing chamber 16 further includes a reaction zone 100 that is formed within the chamber body 14 when the lid assembly 20 is in a closed position. Generally, the reaction zone 100 includes the volume within the processing chamber 16 that is in fluid communication with a wafer 102 disposed therein. The reaction zone 100, therefore, includes the volume downstream of each valve 32c within the lid assembly 20, and the volume between the support pedestal 48 and the lower surface of the lid plate 20. More particularly, the reaction zone 100 includes the volume between the outlet of the dosing valves 32c and an upper surface of the wafer 102.

A controller 70 regulates the operations of the various components of the processing chamber 16. The controller 70 includes a processor 72 in data communication with memory, such as random access memory 74 and a hard disk drive 76 and is in communication with at least the pump system 18, the power source 52, and the valve 32c.

Software routines are executed to initiate process recipes or sequences. The software routines, when executed, transform the general purpose computer into a specific process computer that controls the chamber operation so that a chamber process is performed. For example, software routines may be used to precisely control the activation of the electronic control valves for the execution of process sequences according to the present invention. Alternatively, the software routines may be performed in hardware, as an application specific integrated circuit or other type of hardware implementation, or a combination of software or hardware.

Barrier Layer Formation

Figure 2:
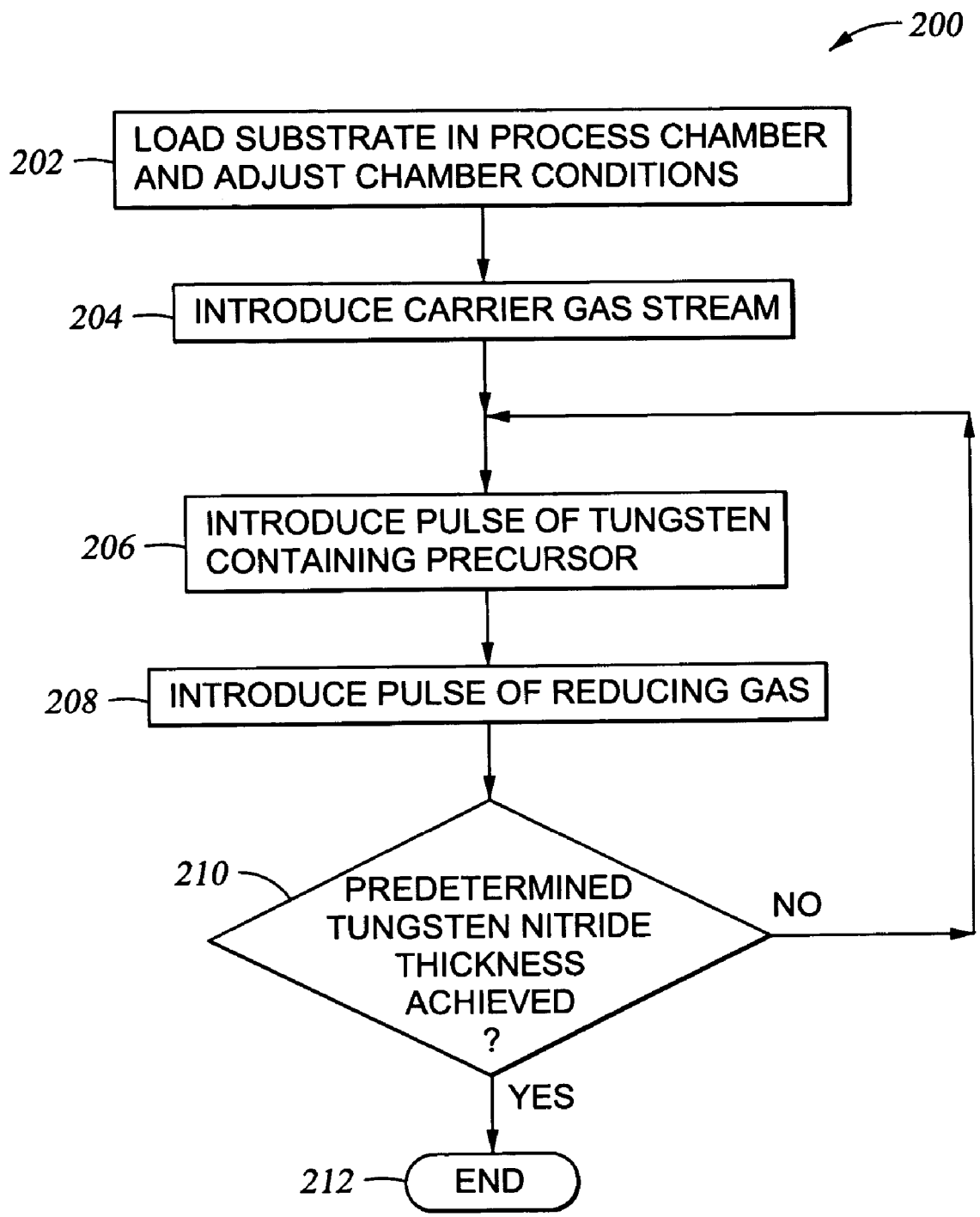
FIG. 2 illustrates a process sequence for the formation of a tungsten nitride barrier layer using a cyclical deposition technique according to one embodiment described herein.

FIG. 2 illustrates a process sequence 200 for depositing a tungsten nitride layer according to one embodiment of the present invention. As shown in step 202, a substrate is provided to the process chamber. The process chamber conditions, such as the temperature and pressure, for example, are adjusted to enhance the adsorption of the process gases on the substrate. The substrate should be maintained at a temperature of about 550° C. or more, such as between 550° C. and 700° C., at a process chamber pressure of between about 1 Torr and about 10 Torr.

A constant carrier gas stream is established within the process chamber as indicated in step 204. Carrier gases may be selected to also act as a purge gas for the removal of volatile reactants and/or by-products from the process chamber. Carrier gases such as, for example, helium (He), argon (Ar), nitrogen ($N_2$), hydrogen ($H_2$), among others, and combinations thereof may be used. In one aspect, argon is continuously provided at a rate between about 250 sccm and about 1000 sccm, such as between about 500 sccm and about 750 sccm.

Referring to step 206, after the carrier gas stream is established within the process chamber, a pulse of a tungsten-containing compound is added to the carrier gas stream. A "dose/pulse" as used herein is intended to refer to a quantity of a particular compound that is intermittently or non-continuously introduced into a reaction zone of a processing chamber. The quantity of a particular compound within each pulse may vary over time, depending on the duration of the pulse.

The duration of the pulse of the tungsten-containing compound is variable depending upon a number of factors such as, for example, the volume capacity of the process chamber employed, the vacuum system coupled thereto, and the volatility/reactivity of the particular precursor itself. For example, the tungsten-containing compound is introduced to the substrate surface at a rate between about 1 sccm (standard cubic centimeters per minute) and about 400 sccm, such as between about 10 sccm and about 100 sccm, and pulsed for about 1 second or less, such as about 0.2 seconds or less. More generally, the process conditions are advantageously selected so that a pulse of tungsten-containing compound provides a sufficient amount of volume to absorb at least a monolayer of the tungsten-containing material on the substrate. Thereafter, excess tungsten-containing compound remaining in the chamber is removed from the process chamber by the constant carrier gas stream in combination with the vacuum system.

In step 208, a pulse of a nitrogen-containing compound is added to the carrier gas stream after the excess tungsten-containing compound has been removed from the process chamber. The pulse of nitrogen-containing compound also lasts for a predetermined time that is variable depending upon a number of factors such as, for example, the volume capacity of the process chamber employed, the vacuum system coupled thereto and the volatility/reactivity of the particular precursor itself. For example, the nitrogen-containing compound is introduced to the substrate surface at a rate between about 5 sccm to about 150 sccm, such as between about 5 sccm and about 25 sccm, and thereafter pulsed for about 1 second or less, such as about 0.2 seconds or less. More generally, the duration of the pulse of nitrogen-containing compound should be long enough to adsorb at least a monolayer of the nitrogen-containing compound on the tungsten-containing material. Thereafter, excess nitrogen-containing compound remaining in the chamber is removed by the constant carrier gas stream in combination with the vacuum system.

The duration of each of the pulses of tungsten-containing compound and nitrogen-containing compound may also vary depending on the device geometry, the desired stoichiometry of the deposited layer, and the application of the deposited layer, for example. In one aspect, the duration of the pulse of tungsten-containing compound may be identical to the duration of the pulse of nitrogen-containing compound. In another aspect, the duration of the pulse of tungsten-containing compound may be shorter than the duration of the pulse of nitrogen-containing compound. In still another aspect, the duration of the pulse of tungsten-containing compound may be longer than the duration of the pulse of nitrogen-containing compound.

Additionally, the delays between each pulse of tungsten-containing compound and each pulse of nitrogen-containing compound may have the same duration. That is the duration of the period of non-pulsing between each pulse of the tungsten-containing compound and each pulse of the nitrogen-containing compound can be identical. For such an embodiment, a time interval of non-pulsing between the pulse of the tungsten-containing compound and the pulse of the nitrogen-containing compound is equal to a time interval of non-pulsing between the pulse of the nitrogen-containing compound and the pulse of the tungsten-containing precursor. During the time periods of non-pulsing only the constant carrier gas stream is provided to the process chamber.

The delays between each pulse of tungsten-containing compound and each pulse of nitrogen-containing compound may also have different durations. For example, the duration of the period of non-pulsing between each pulse of the tungsten-containing compound and each pulse of the nitrogen-containing compound may be shorter or longer than the duration of the period of non-pulsing between each pulse of the nitrogen-containing compound and the tungsten-containing precursor. For such an embodiment, a time interval of non-pulsing between the pulse of the tungsten-containing compound and the pulse of the nitrogen-containing compound is different from a time interval of non-pulsing between the pulse of the nitrogen-containing compound and the pulse of the tungsten-containing precursor. During the time periods of non-pulsing, only the constant carrier gas stream is provided to the process chamber.

Additionally, the time intervals for each pulse of the tungsten-containing precursor, the nitrogen-containing compound and the periods of non-pulsing therebetween for each deposition cycle may have the same duration. For such an embodiment, a time interval ($T_1$) for the tungsten-containing precursor, a time interval ($T_2$) for the nitrogen-containing compound, a time interval ($T_3$) of non-pulsing between the pulse of the tungsten-containing compound and the pulse of the nitrogen-containing compound and a time interval ($T_4$) of non-pulsing between the pulse of the nitrogen-containing compound and the pulse of the tungsten-containing compound each have the same value for each deposition cycle. For example, in a first deposition cycle ($C_1$), a time interval ($T_1$) for the pulse of the tungsten-containing compound has the same duration as the time interval ($T_1$) for the pulse of the tungsten-containing compound in a second deposition cycle ($C_2$). Similarly, the duration of each pulse of the nitrogen-containing compound and the periods of non-pulsing between the pulse of the tungsten-containing compound and the nitrogen-containing compound in deposition cycle ($C_1$) is the same as the duration of each pulse of the nitrogen-containing compound and the periods of non-pulsing between the pulse of the tungsten-containing compound and the nitrogen-containing compound in deposition cycle ($C_2$), respectively.

Additionally, the time intervals for at least one pulse of tungsten-containing precursor, at least one pulse of nitrogen-containing compound, and the delays therebetween for one or more of the deposition cycles of the tungsten deposition process may have different durations. For such an embodiment, one or more of the time intervals ($T_1$) for the pulses of the tungsten-containing precursor, the time intervals ($T_2$) for the pulses of the nitrogen-containing compound, the time intervals ($T_3$) of non-pulsing between the pulse of the tungsten-containing compound and the pulse of the nitrogen-containing compound and the time intervals ($T_4$) of non-pulsing between the pulse of the nitrogen-containing compound and the pulse of the tungsten-containing compound may have different values for one or more deposition cycles of the tungsten deposition process. For example, in a first deposition cycle ($C_1$), the time interval ($T_1$) for the pulse of the tungsten-containing compound may be longer or shorter than the time interval ($T_1$) for the pulse of the tungsten-containing compound in a second deposition cycle ($C_2$). Similarly, the duration of each pulse of the nitrogen-containing compound and the periods of non-pulsing between the pulse of the tungsten-containing compound and the nitrogen-containing compound in deposition cycle ($C_1$) may be the same or different than the duration of each pulse of the nitrogen-containing compound and the periods of non-pulsing between the pulse of the tungsten-containing compound and the nitrogen-containing compound in deposition cycle ($C_2$), respectively.

Referring to step 210, after each deposition cycle (steps 204 through 208) a thickness of tungsten nitride will be formed on the substrate. Depending on specific device requirements, subsequent deposition cycles may be needed to achieve a desired thickness. As such, steps 206 and 208 can be repeated until the desired thickness for the tungsten nitride layer is achieved. Thereafter, when the desired thickness is achieved the process is stopped as indicated by step 212. About 2 angstroms to about 3 angstroms of tungsten nitride, such as about 2.5 angstroms, are formed per cycle.

Exemplary tungsten-containing precursors for forming such tungsten layers may include tungsten hexafluoride ($WF_6$) and tungsten hexacarbonyl ($W(CO)_6$), among others, as well as a combination thereof.

Exemplary nitrogen-containing compounds may include nitrogen gas ($N_2$), ammonia ($NH_3$), hydrazine ($N_2H_4$), monomethyl hydrazine ($CH_3N_2H_3$), dimethyl hydrazine ($C_2H_6N_2H_2$), t-butyl hydrazine ($C_4H_9N_2H_3$), phenyl hydrazine ($C_6H_5N_2H_3$), 2,2'-azotertbutane (($CH_3)_6C_2N_2$), ethylazide ($C_2H_5N_3$), among others, as well as combinations thereof.

Figure 3:
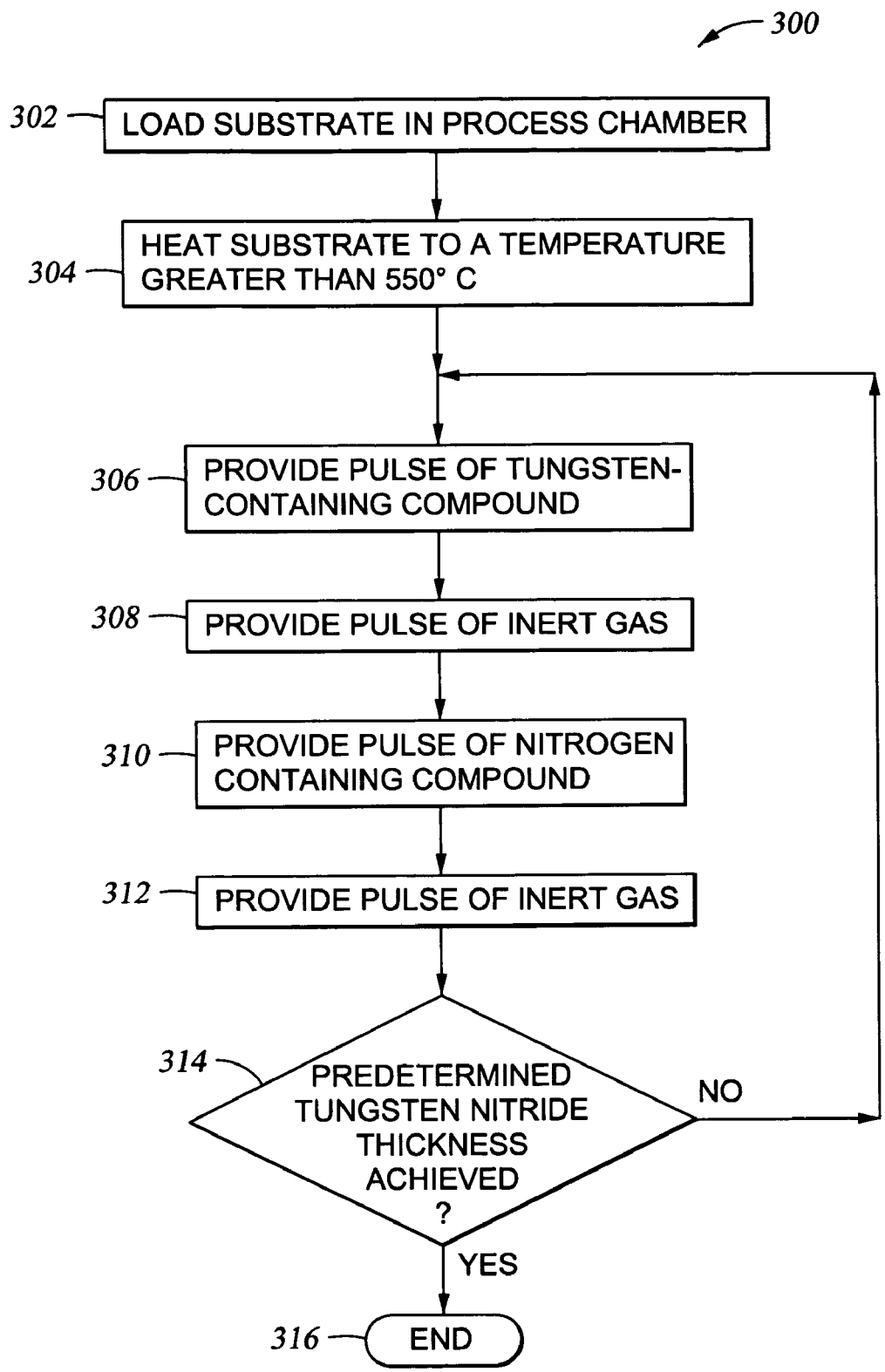
FIG. 3 illustrates a process sequence for the formation of a tungsten nitride layer using a cyclical deposition technique according to another embodiment described herein.

In a particular process sequence 300 described with respect to FIG. 3, a tungsten nitride layer is deposited using separate pulses for each of the tungsten-containing compound, the nitrogen-containing compound, and argon. The deposition sequence 300 includes providing a substrate to the process chamber (step 302); heating the substrate to a temperature greater than 550° C., such as between 550° C. and 700° C. at a pressure less than or about 2 Torr (step 304); providing a pulse of tungsten-containing compound (step 306); providing a first pulse of argon (step 308); providing a pulse of nitrogen-containing compound (step 310); providing a second pulse of argon (step 312); and then repeating steps 304 through 312 until a desired thickness of the tungsten nitride layer has been achieved. Thereafter, the process is stopped (step 316) when the desired thickness is achieved. About 2 angstroms to about 3 angstroms of titanium nitride are formed per cycle.

In FIGS. 2–3, the tungsten deposition cycle is depicted as beginning with a pulse of the tungsten-containing compound followed by a pulse of the nitrogen-containing compound. However, the tungsten deposition cycle may start with a pulse of the nitrogen-containing compound followed by a pulse of the tungsten-containing precursor. Regardless of the pulse sequences, each cycle consists of a pulse of the nitrogen-containing compound and a pulse of the tungsten-containing compound, and cycle is repeated until a desired film or film thickness is achieved.

Figure 4:
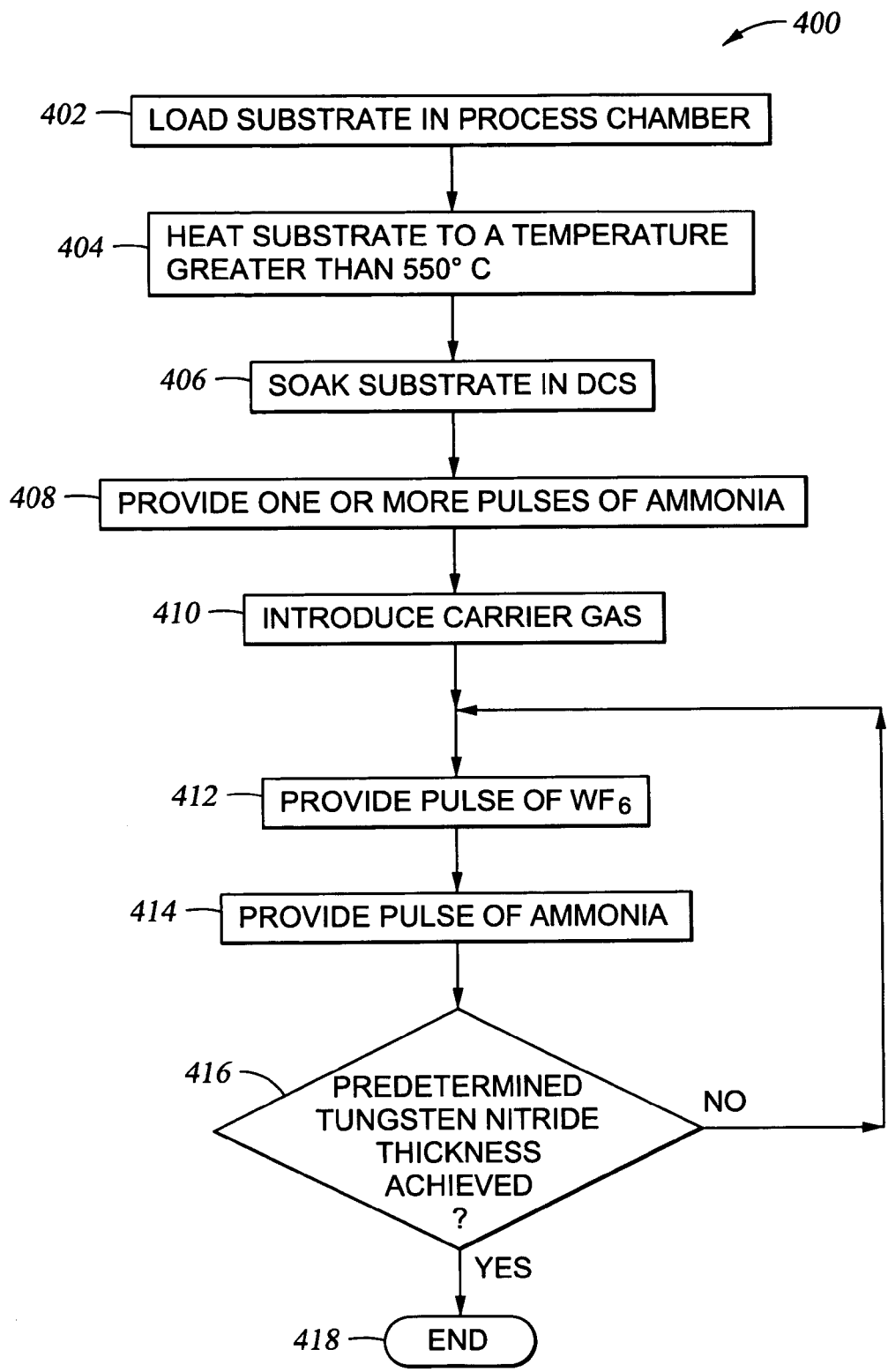
FIG. 4 illustrates a process sequence for the formation of a tungsten nitride layer using a cyclical deposition technique according to another embodiment described herein.

FIG. 4 shows another process sequence 400 particularly useful for depositing a tungsten nitride barrier layer over a silicon surface. In general, a wafer having a silicon surface is exposed to a chlorine-containing compound, such as dichlorosilane (DCS) for example, prior to alternating pulses of a nitrogen-containing compound and a tungsten-containing compound. The DCS pre-treatment step provides a chlorine terminated silicon surface that resists the formation of tungsten silicide during subsequent exposure to a tungsten-containing compound. Tungsten suicide is undesirable because it increases the resistivity and overall contact resistance of the device.

The nitrogen-containing compound is introduced prior to the tungsten-containing compound to prevent the formation of tungsten suicide due to the reaction of tungsten with the silicon surface. It is believed that the nitrogen-containing compound forms one or more atomic layers of $Si_xN_y$ prior to exposure of the tungsten-containing compound. It is then believed that the one or more atomic layers of $Si_xN_y$ react with the tungsten-containing compound to form one or more atomic layers of $WSi_xN_y$. The one or more atomic layers of $WSi_xN_y$ provide a much more stable device that is resistant to tungsten diffusion/migration. In metal gate applications, for example, tungsten migration is to be avoided because tungsten atoms may diffuse through the polysilicon gate and come into contact with the dielectric layer, thereby shorting the metal gate.

Referring to FIG. 4, the deposition sequence 400 includes providing a substrate to the process chamber (step 402); heating the substrate to a temperature greater than 550° C., such as between 550° C. and 700° C. at a pressure less than or about 2 Torr (step 404); soaking the substrate in DCS for about 5 seconds to about 1 minute (step 406); providing one or more pulses of ammonia (step 408); introducing a continuous carrier gas stream such as argon gas (step 410); providing a pulse of tungsten hexafluoride (step 412); providing a pulse of ammonia (step 414); and then repeating steps 412 through 414 or stopping the deposition process (step 418) depending on whether a desired thickness for the tungsten nitride layer has been achieved (step 416).

Figure 4A:
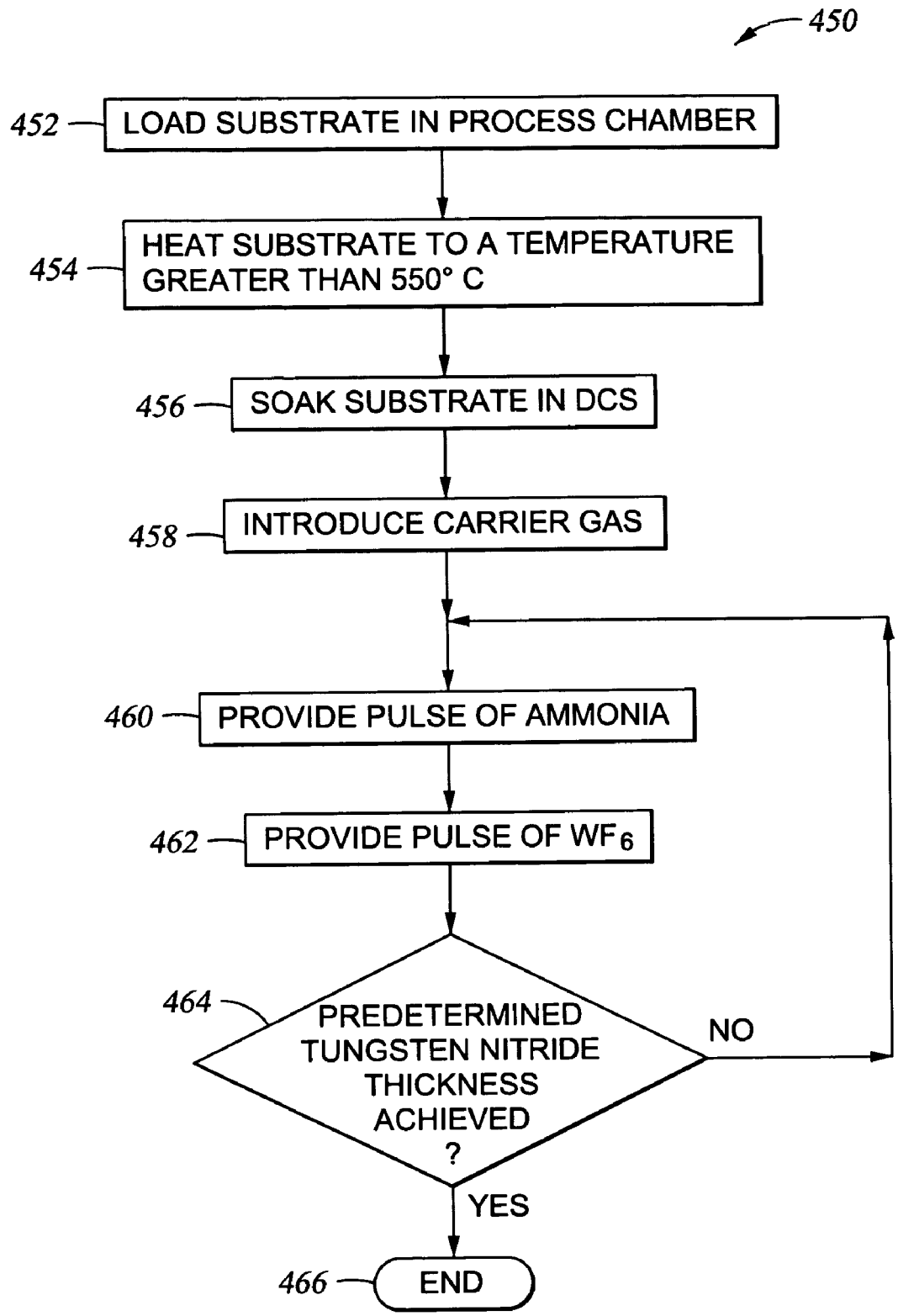
FIG. 4A illustrates a process sequence for the formation of a tungsten nitride layer particularly on a silicon surface using a cyclical deposition technique according to another embodiment described herein.

FIG. 4A shows an alternative process sequence 450 useful for depositing a tungsten nitride barrier layer over a silicon surface. The sequence 450 includes providing a substrate to the process chamber (step 452); heating the substrate to a temperature greater than 550° C., such as between 550° C. and 700° C. at a pressure less than or about 2 Torr (step 454); soaking the substrate in DCS for about 5 seconds to about 1 minute (step 456); introducing a continuous carrier gas stream such as argon gas (step 458); providing a pulse of ammonia (step 460); providing a pulse of tungsten hexafluoride (step 462); and then repeating steps 460 through 462 or stopping the deposition process (step 466) depending on whether a desired thickness for the tungsten nitride layer has been achieved (step 466).

Tungsten Metal Gate

Figure 5:
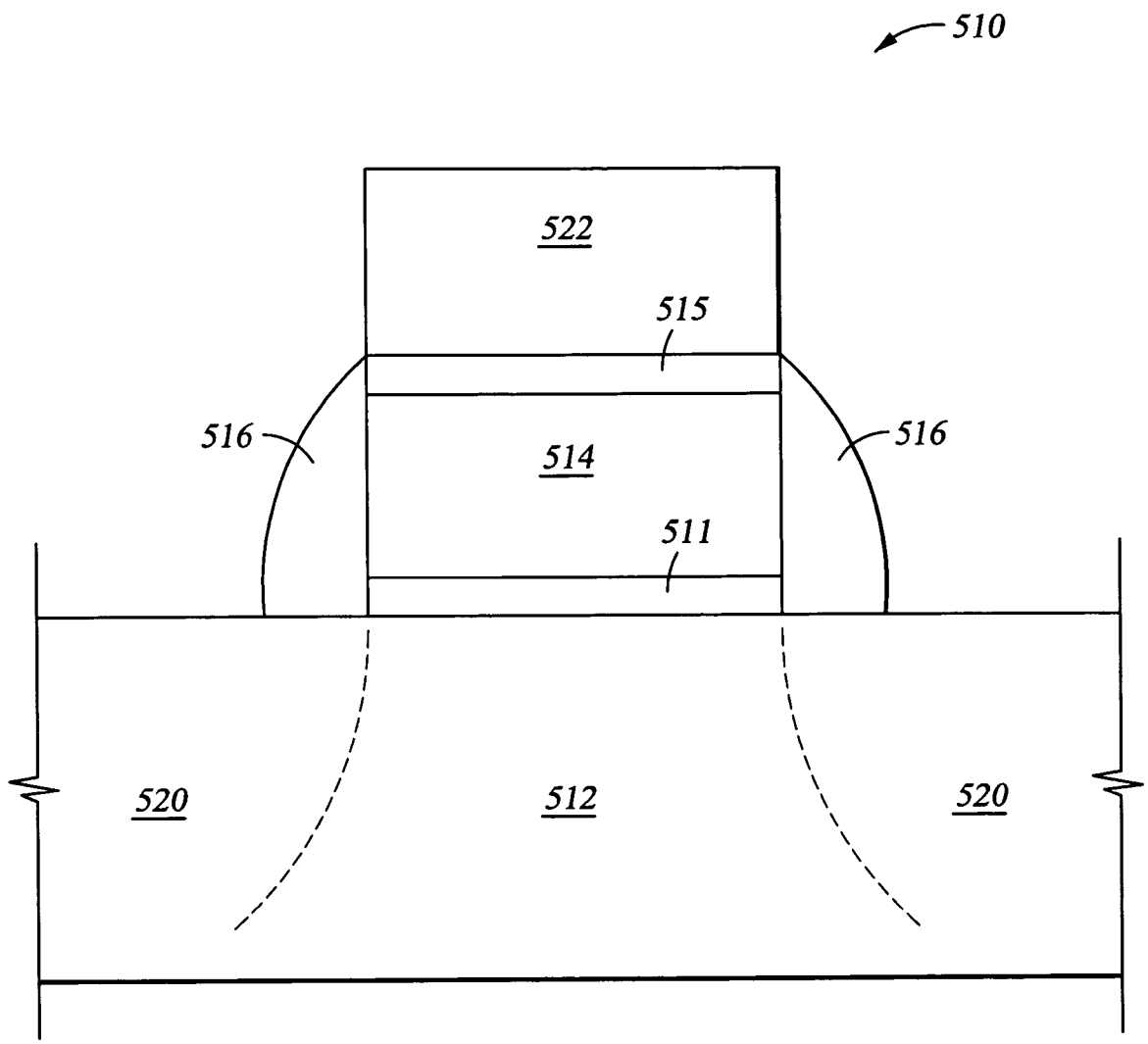
FIG. 5 shows a cross sectional view of an exemplary metal oxide gate device 10 utilizing a tungsten nitride layer according to the present invention.

FIG. 5 shows a cross sectional view of an exemplary metal oxide gate device utilizing a tungsten nitride barrier layer according to the present invention. The device generally includes an exposed gate 510 surrounded by spacers 516 and silicon source/drain areas 520 formed within a substrate surface 512. The spacers 516 typically consist of an oxide, such as $SiO_2$.

The metal gate 510 includes an oxide layer 511, a polysilicon layer 514, a tungsten nitride layer 515, and a tungsten layer 522. The oxide layer 511, such as a $SiO_2$ layer for example, separates the substrate 512 from the polysilicon layer 514. The oxide layer 511 and the polysilicon layer 514 are deposited using conventional deposition techniques.

The tungsten nitride layer 515 is deposited on the polysilicon layer 514 and is deposited using embodiments of a cyclical deposition technique described above with reference to FIGS. 2–4. In a particular embodiment, similar to the sequence described above with reference to FIG. 4, a process sequence for depositing the tungsten nitride layer 515 on the polysilicon layer 514 includes providing a substrate to the process chamber; heating the substrate to a temperature greater than 550° C., such as between 550° C. and 700° C. at a pressure less than or about 2 Torr; soaking the substrate in DCS for about 5 seconds to about 1 minute; providing one or more pulses of ammonia; introducing a continuous carrier gas stream such as argon gas; providing a pulse of tungsten hexafluoride to the reaction zone; providing a pulse of ammonia to the reaction zone; and then repeating the pulses of tungsten hexafluoride and ammonia until a tungsten nitride layer having a thickness less than 100 angstroms has been formed.

A tungsten layer 522 is then deposited on the tungsten nitride layer 515. Although any metal deposition process, such as conventional chemical vapor deposition or physical vapor deposition for example, may be used, the tungsten layer 522 may be deposited by alternately adsorbing a tungsten-containing compound and a reducing gas, using a cyclical deposition technique similar to one described above with reference to FIGS. 2–4. Suitable tungsten-containing compounds include, for example, tungsten hexafluoride ($WF_6$) and tungsten hexacarbonyl ($W(CO)_6$), among others. Suitable reducing gases include, for example, silane ($SiH_4$), disilane ($Si_2H_6$), dichlorosilane ($SiCl_2H_2$), borane ($BH_3$), diborane ($B_2H_6$), triborane, tetraborane, pentaborane, hexaborane, heptaborane, octaborane, nonaborane, decaborane and combinations thereof.

One exemplary process of depositing a tungsten layer includes sequentially providing pulses of tungsten hexafluoride and pulses of diborane. The tungsten hexafluoride may be provided to an appropriate flow control valve at a flow rate of between about 10 sccm (standard cubic centimeters per minute) and about 400 sccm, such as between about 20 sccm and about 100 sccm, and thereafter pulsed for about 1 second or less, such as about 0.2 seconds or less. A carrier gas, such as argon, is provided along with the tungsten hexafluoride at a flow rate between about 250 sccm to about 1,000 sccm, such as between about 500 sccm to about 750 sccm. The diborane may be provided to an appropriate flow control valve at a flow rate of between about 5 sccm and about 150 sccm, such as between about 5 sccm and about 25 sccm, and thereafter pulsed for about 1 second or less, such as about 0.2 seconds or less. A carrier gas, such as argon, is provided along with the diborane at a flow rate between about 250 sccm to about 1,000 sccm, such as between about 500 sccm to about 750 sccm. The substrate is maintained at a temperature between about 250° C. and about 350° C. at a chamber pressure between about 1 Torr and about 10 Torr.

Another exemplary process of depositing a tungsten layer includes sequentially providing pulses of tungsten hexafluoride and pulses of silane. The tungsten hexafluoride is provided to an appropriate flow control valve at a flow rate of between about 10 sccm and about 400 sccm, such as between about 20 sccm and about 100 sccm, and thereafter pulsed for about 1 second or less, such as about 0.2 seconds or less. A carrier gas, such as argon, is provided along with the tungsten hexafluoride at a flow rate between about 250 sccm to about 1,000 sccm, such as between about 300 sccm to about 500 sccm. The silane is provided to an appropriate flow control valve at a flow rate of between about 10 sccm to about 500 sccm, such as between about 50 sccm to about 200 sccm, and thereafter pulsed for about 1 second or less, such as about 0.2 seconds or less. A carrier gas, such as argon, is provided along with the silane at a flow rate between about 250 sccm and about 1,000 sccm, such as between about 300 sccm to about 500 sccm. A pulse of a purge gas, such as argon, at a flow rate between about 300 sccm to about 1,000 sccm, such as between about 500 sccm to about 750 sccm, in pulses of about 1 second or less, such as about 0.3 seconds or less is provided between the pulses of the tungsten hexafluoride and the pulses of silane. The substrate is maintained at a temperature between about 300° C. to about 400° C. at a chamber pressure between about 1 Torr and about 10 Torr.

A more detailed description of tungsten deposition using a cyclical deposition technique may be found in commonly assigned U.S. patent application Ser. No. 10/016,300, entitled "Lid Assembly For A Processing System To Facilitate Sequential Deposition Techniques," filed on Dec. 12, 2001; published as U.S. Patent Application 20030010451 and in commonly assigned U.S. patent application Ser. No. 10/082,048, entitled "Deposition Of Tungsten Films For Dynamic Random Access Memory (DRAM) Application," filed on Feb. 20, 2002, published as U.S. Application 20030157760, which are both incorporated herein by reference.

Figure 6:
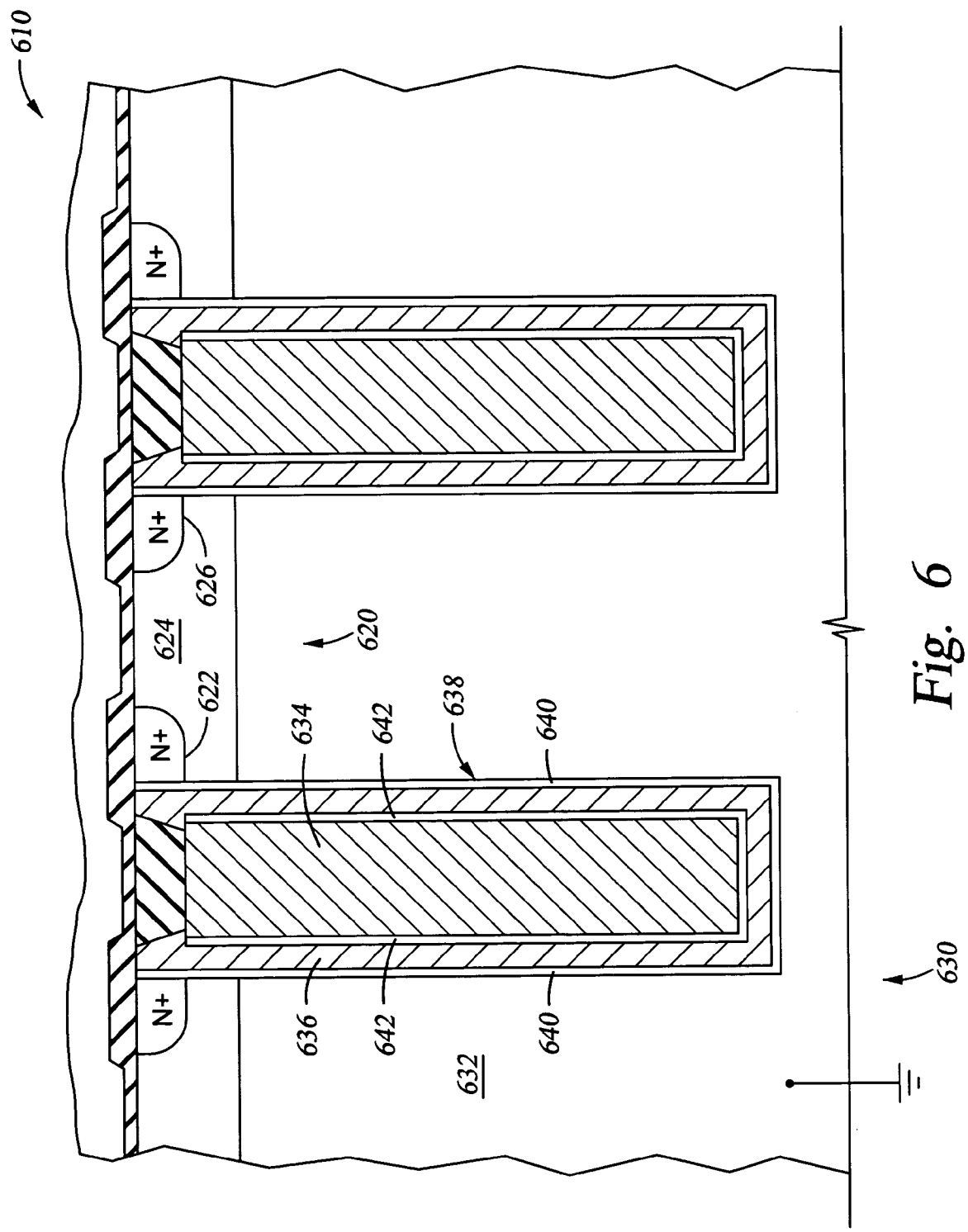
FIG. 6 shows a cross sectional view of a conventional DRAM device utilizing a tungsten nitride layer deposited according to an embodiment of a cyclical deposition technique described herein.

FIG. 6 shows another exemplary use of a tungsten nitride barrier layer. More particularly, FIG. 6 is a cross sectional view of a conventional DRAM device having a transistor 620 positioned adjacent a top portion of a trench capacitor 630. The access transistor 620 for the DRAM device 610 is positioned adjacent a top portion of the trench capacitor 630. Preferably, the access transistor 620 comprises an n-p-n transistor having a source region 622, a gate region 624, and a drain region 626. The gate region 624 comprises a P– doped silicon epi-layer disposed over the P+ substrate. The source region 622 of the access transistor 620 comprises an N+ doped material disposed on a first side of the gate region 624, and the drain region 626 comprises an N+ doped material disposed on a second side of the gate region 624, opposite the source region 622. The source region 622 is connected to an electrode of the trench capacitor.

The trench capacitor 630 generally comprises a first electrode 632, a second electrode 634 and a dielectric material 636 disposed therebetween. The P+ substrate serves as a first electrode 632 of the trench capacitor 630 and is connected to a ground connection. A trench 638 is formed in the P+ substrate and filled with a heavily doped N+ polysilicon which serves as the second electrode 634 of the trench capacitor 630. The dielectric material 636 is disposed between the first electrode 632 (i.e., P+ substrate) and the second electrode 634 (i.e., N+ polysilicon).

In one aspect, the trench capacitor 630 also includes a first tungsten nitride barrier layer 640 disposed between the dielectric material 636 and the first electrode 632. Preferably, a second tungsten nitride barrier layer 642 is disposed between the dielectric material 636 and the second electrode 634. Alternatively, the barrier layers 640, 642 are a combination film, such as W/WN. The barrier layers 640, 642 are deposited utilizing embodiments of the cyclical deposition techniques described herein.

Although the above-described DRAM device utilizes an n-p-n transistor, a P+ substrate as a first electrode, and an N+ polysilicon as a second electrode of the capacitor, other transistor designs and electrode materials are contemplated by the present invention to form DRAM devices. Additionally, other devices, such as crown capacitors for example, are contemplated by the present invention.

Embodiments of depositing a tungsten nitride barrier layer using cyclical deposition techniques described herein will be further described below in the following non-limiting example.

EXAMPLE

A tungsten nitride barrier layer was deposited within a cyclical deposition chamber similar to the chamber described above with reference to FIG. 2. The tungsten nitride barrier layer was deposited on a polysilicon layer. The barrier layer was deposited at about 680° C. and about 1.5 Torr. Argon was continuously introduced into the chamber at about 500 sccm. Pulses of tungsten hexafluoride and ammonia were alternately pulsed into the processing chamber, and 40 cycles were performed. Each pulse of tungsten hexafluoride had a rate of about 3 sccm and a duration of about 5 seconds. Each pulse of ammonia had a rate of about 300 sccm and a duration of about 20 seconds. The time delay between pulses was about 20 seconds. The deposition rate was about 2.5 angstroms per minute. The resulting tungsten nitride layer had a thickness of about 350 angstroms.

Figure 7:
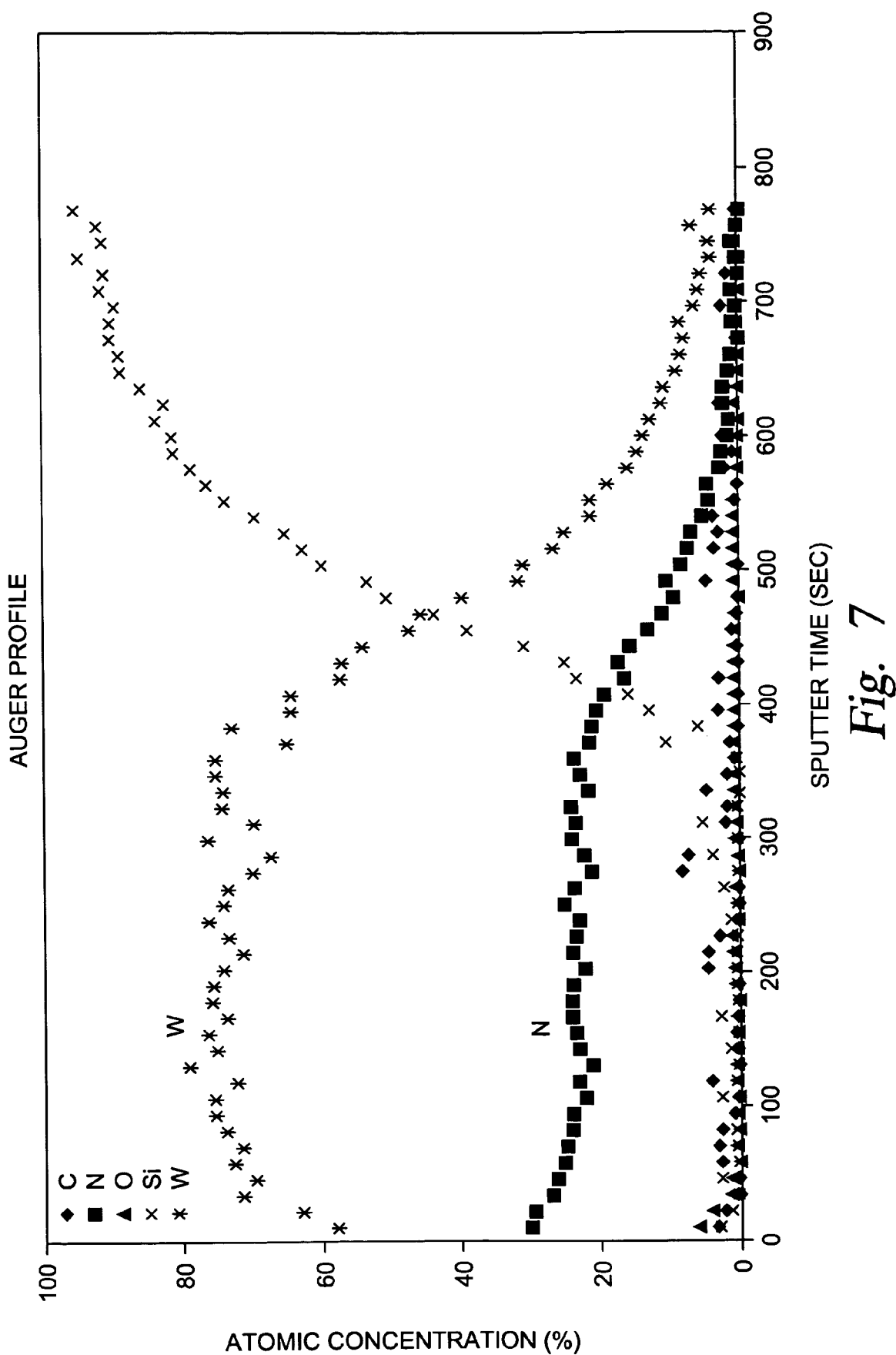
FIG. 7 shows an Auger profile showing the atomic concentration of the deposited tungsten nitride layer.

FIG. 7 shows an Auger profile showing the atomic concentration of the deposited tungsten nitride layer. It was surprisingly found that the cyclical deposition technique provided a substantially stoichiometric $W_2N$ layer without the need for an additional thermal anneal post-treatment. Further, the deposited stoichiometric $W_2N$ layer had a significantly reduced fluorine concentration compared to plasma enhanced chemical vapor deposition (PECVD) WN. The measured resistivity of the barrier layer was 380 µohms-cm, which is about 50 percent less than a comparable low pressure chemical vapor deposition (LPCVD) WN layer and about 60 percent less than a PVD WN layer.

While the foregoing is directed to embodiments of the present invention, other and further embodiments of the invention may be devised without departing from the basic scope thereof, and the scope thereof is determined by the claims that follow.

The invention claimed is:

1. A method for forming a tungsten layer on a substrate, comprising:
   depositing a tungsten nitride barrier layer on a substrate by alternately pulsing a first tungsten-containing compound and a nitrogen-containing compound into a process chamber; and
   depositing a tungsten-containing layer on the tungsten nitride barrier layer by alternately exposing the substrate to a second tungsten-containing compound and a reductant.

2. The method of claim 1, wherein the first tungsten-containing compound and the second tungsten-containing compound are independently selected from the group consisting of tungsten hexafluoride, tungsten carbonyl, and derivatives thereof.

3. The method of claim 2, wherein the first tungsten-containing compound and the second tungsten-containing compound are both tungsten hexafluoride.

4. The method of claim 2, wherein the nitrogen-containing compound is selected from the group consisting of nitrogen gas, ammonia, hydrazine, monomethyl hydrazine, dimethyl hydrazine, t-butyl hydrazine, phenyl hydrazine, 2,2'-azotertbutane, ethylazide, derivatives thereof, and combinations thereof.

5. The method of claim 3, wherein the nitrogen-containing compound comprises ammonia.

6. The method of claim 2, wherein the reductant is selected from the group consisting of silane, disilane, dichlorosilane, borane, diborane, triborane, tetraborane, pentaborane, derivatives thereof, and combinations thereof.

7. The method of claim 6, wherein the reductant is silane.

8. The method of claim 5, wherein the reductant is diborane.

9. A method for forming a tungsten layer on a substrate, comprising:
depositing a tungsten nitride barrier layer on a substrate by alternately pulsing a first tungsten-containing compound and a nitrogen-containing compound into a process chamber; and
depositing a tungsten-containing layer on the tungsten nitride barrier layer.

10. The method of claim 9, wherein the tungsten-containing layer is deposited by chemical vapor deposition or physical vapor deposition techniques.

11. The method of claim 9, wherein the tungsten-containing layer is deposited by alternately exposing the substrate to a second tungsten-containing compound and a reductant.

12. The method of claim 11, wherein the tungsten-containing layer is deposited by alternately pulsing the second tungsten-containing compound and the reductant to form a pre-layer having a thickness of about 50 Å or less and subsequently, depositing a bulk tungsten material on the pre-layer during a chemical vapor deposition process.

13. The method of claim 11, wherein the first tungsten-containing compound and the second tungsten-containing compound are both tungsten hexafluoride.

14. The method of claim 13, wherein the nitrogen-containing compound is selected from the group consisting of nitrogen gas, ammonia, hydrazine, monomethyl hydrazine, dimethyl hydrazine, t-butyl hydrazine, phenyl hydrazine, 2,2'-azotertbutane, ethylazide, derivatives thereof, and combinations thereof.

15. The method of claim 14, wherein the reductant is selected from the group consisting of silane, disilane, dichlorosilane, borane, diborane, triborane, tetraborane, pentaborane, derivatives thereof, and combinations thereof.

16. A method for forming a tungsten layer on a substrate, comprising:
exposing a substrate to a reducing compound during a soak process;
depositing a tungsten nitride barrier layer on the substrate by alternately pulsing a tungsten-containing compound and a nitrogen-containing compound into a process chamber; and
depositing a tungsten-containing layer on the tungsten nitride barrier layer.

17. The method of claim 16, wherein the tungsten-containing layer is deposited by a process selected from the group consisting of cyclic deposition, chemical vapor deposition, and physical vapor deposition.

18. The method of claim 17, wherein the tungsten-containing layer is deposited during a cyclic deposition process sequentially exposing the substrate to the tungsten-containing compound and a reductant.

19. The method of claim 18, wherein the tungsten-containing compound is tungsten hexafluoride and the nitrogen-containing compound is ammonia.

20. The method of claim 19, wherein the reductant is selected from the group consisting of silane, disilane, dichlorosilane, borane, diborane, triborane, tetraborane, pentaborane, derivatives thereof, and combinations thereof.

21. The method of claim 16, wherein the substrate is exposed to the reducing compound during the soak process for a time period within a range from about 5 seconds to about 1 minute.

22. The method of claim 21, wherein the reducing compound comprises a silane compound.

23. A method for forming a tungsten layer on a substrata, comprising:
positioning a substrate within a process chamber;
exposing the substrate to a reducing compound during a soak process;
exposing the substrate sequentially to a tungsten-containing compound and a nitrogen-containing compound to form a tungsten nitride barrier layer during a cyclic layer deposition process; and
exposing the substrate to the tungsten-containing compound and a reductant to deposit a tungsten-containing layer on the tungsten nitride barrier layer, wherein the reductant is selected from the group consisting of silane, diborane, derivatives thereof, and combinations thereof.

* * * * *

UNITED STATES PATENT AND TRADEMARK OFFICE
CERTIFICATE OF CORRECTION

PATENT NO. : 7,115,499 B2  Page 1 of 1
APPLICATION NO. : 11/003020
DATED : October 3, 2006
INVENTOR(S) : Wang et al.

It is certified that error appears in the above-identified patent and that said Letters Patent is hereby corrected as shown below:

Title Page Item (56), References Cited, U.S. PATENT DOCUMENTS: Please include the following reference:

4,859,625        8/1989    Nishizawa et al.

Column 9, Line 6: Change "suicide" to --silicide--

Column 9, Line 11: Change "suicide" to --silicide--

Column 14, Claim 23, Line 28: Change "substrata" to --substrate--

Signed and Sealed this

Sixth Day of February, 2007

JON W. DUDAS
*Director of the United States Patent and Trademark Office*